United States Patent
Asakawa et al.

[11] Patent Number: 5,934,856
[45] Date of Patent: Aug. 10, 1999

[54] MULTI-CHAMBER TREATMENT SYSTEM

[75] Inventors: Teruo Asakawa; Hiroaki Saeki, both of Ryuo-cho, Japan

[73] Assignee: Tokyo Electron Limited, Tokyo-to, Japan

[21] Appl. No.: 08/837,948

[22] Filed: Apr. 28, 1997

Related U.S. Application Data

[63] Continuation-in-part of application No. 08/447,247, May 22, 1995, abandoned.

[30] Foreign Application Priority Data

| May 23, 1994 | [JP] | Japan | 6-108483 |
| Jun. 7, 1994 | [JP] | Japan | 6-148485 |

[51] Int. Cl.⁶ .................................................. B65G 49/07
[52] U.S. Cl. .................. 414/217; 414/744.5; 414/744.6; 414/939
[58] Field of Search ................................. 414/217, 225, 414/416, 744.2, 744.5, 744.6, 935, 937, 939, 941

[56] References Cited

U.S. PATENT DOCUMENTS

| 4,483,654 | 11/1984 | Koch et al. | 414/744.5 |
| 4,797,061 | 1/1989 | Munakata | 414/744.5 |
| 5,049,029 | 9/1991 | Mitsui et al. | 414/935 X |
| 5,151,008 | 9/1992 | Ishida et al. | 414/744.5 |
| 5,611,655 | 3/1997 | Fukasawa et al. | 414/217 |
| 5,636,963 | 6/1997 | Haraguchi et al. | 414/935 X |

FOREIGN PATENT DOCUMENTS

| 2224988 | 9/1990 | Japan | 414/935 |
| 6140492 | 5/1994 | Japan | 414/935 |

*Primary Examiner*—James W. Keenan
*Attorney, Agent, or Firm*—Smith, Gambrell & Russell, LLP; Beveridge, DeGrandi, Weilacher & Young Intellectual Property Group

[57] ABSTRACT

Vacuum process chambers are increased or decreased in number when the kind or order of processes is changed, and the shape and size of the transfer chamber are changed with the increase or decrease of the number of the vacuum process chambers, without entailing any change in a load-lock chamber and a transfer arm. The transfer arm has a minimum radius of rotation such that the arm can rotate in a transfer chamber of a minimum size corresponding to a minimum number of vacuum process chambers and a maximum arm reach such that the arm can deliver an object to-be-treated between each vacuum process chamber and a transfer chamber of a maximum size corresponding to a maximum number of vacuum process chambers. Thus, even though the number of the vacuum process chambers are increased or decreased with the change of the processes, it is necessary only that the shape and size of the transfer chamber be changed, and the other components, such as the load-lock chamber, transfer arm, etc., can be used in common, so that the manufacture and assembling of the system are very easy, ensuring a reduction in cost. Also, reduced-pressure treatment apparatus and a normal-pressure treatment apparatus are connected to each other by means of the load-lock chamber for replacement between the atmosphere and vacuum.

12 Claims, 12 Drawing Sheets

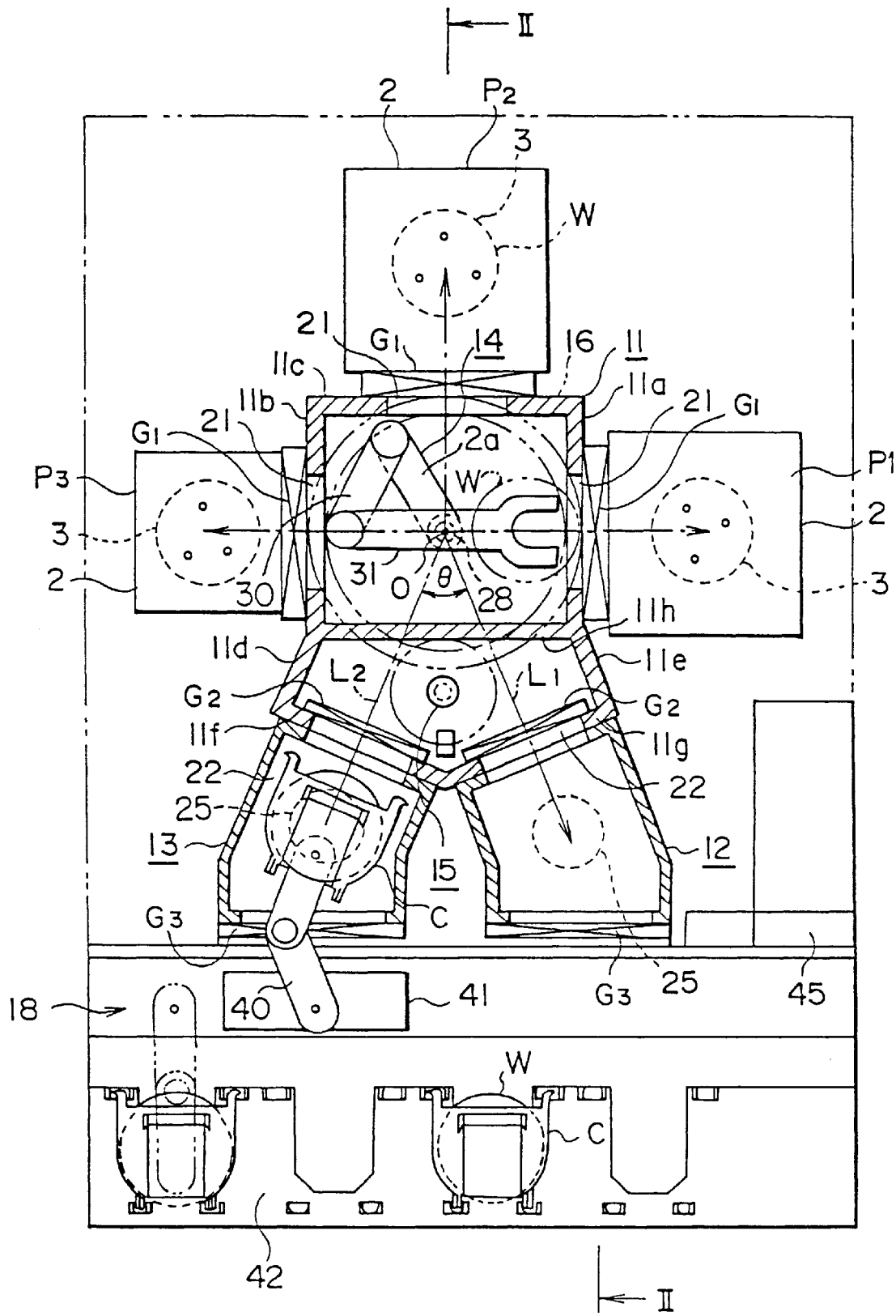
F I G. 1

MULTI-CHAMBER TREATMENT SYSTEM

This application is a continuation-in-part of U.S. application Ser. No. 08/447,247 filed on May 22, 1995 (abandoned). This application incorporates the subject matter of U.S. application Ser. No. 08/447,247 therein in accordance with 35 U.S.C. §120.

BACKGROUND OF THE INVENTION

1. Field of the Invention

The present invention relates to a multi-chamber treatment system provided with a plurality of vacuum process chambers for treating objects to-be-treated, such as semiconductor wafers, LCD substrates, etc., and more particularly, to a multi-chamber treatment system for executing a normal-pressure treatment as a pre- or post-treatment for a reduced-pressure treatment.

2. Information of the Related Art

Recently, various semiconductor manufacturing processes have been contrived to tackle the development of finer, higher-integration versions of semiconductor devices. As vacuum treatment systems for semiconductor wafers, for example, multi-chamber treatment systems called cluster tools or the like have been developed such that a plurality of vacuum process chambers are arranged circumferentially to cope with reformation or modification of various processes easily and shorten the processes through the execution of integrated treatments.

One such conventional multi-chamber treatment system is provided with a required number of vacuum process chambers (supposedly three to six in number, for example) which correspond individually to various semiconductor manufacturing processes. A transportation system for loading into or unloading an object to-be-treated from the individual vacuum process chambers comprises one or two load-lock chambers, a polygonal transfer chamber, and a rotatable contractible transfer arm (transfer robot) in the transfer chamber. The peripheral wall of the transfer chamber is formed with a plurality of junction ports which communicate airtightly with the surrounding vacuum process chambers and load-lock chambers by means of gate valves, individually.

In the multi-chamber treatment system of this type, objects to-be-treated, such as semiconductor wafers (hereinafter referred to simply as wafers) stored in a cassette, are carried into each of the load-lock chambers by means of an external transportation apparatus. Then, the gate valve of the load-lock chamber on the transfer chamber side is opened after the load-lock chamber is evacuated or loaded with an inert gas for replacement so that it is isolated from the outside. The wafers are fetched one after another from the cassette in the load-lock chamber into the transfer chamber by means of the transfer arm, and are transferred successively into the vacuum process chambers. Then, predetermined treatments, such as filming, etching, etc., are executed, and the treated wafers are taken out into the transfer chamber and returned to the cassette in the load-lock chamber by the transfer arm.

In the multi-chamber treatment system arranged in this manner, the load-lock chambers, transfer chamber, and transfer arm, which constitute the transportation system, can be used in common for the vacuum process chambers which are arranged circumferentially. As compared with a conventional treatment apparatus which includes transportation systems provided individually for the vacuum process chambers, therefore, the multi-chamber treatment system is very advantageous, enjoying a simpler configuration, reduced installation space, and improved transportation efficiency.

According to the conventional multi-chamber treatment system, however, a necessary number of vacuum process chambers are selected and provided individually for various processes in compliance with users' requests. A transfer chamber with a suitable shape and size is manufactured in consideration of interfaces with the vacuum process chambers on the basis of the shape and size of the process chambers, and the process chambers are fixedly arranged around the transfer chamber so as to communicate airtightly therewith by means of the gate valves, individually. The load-lock chambers are attached to an end portion (loading portion side) of the peripheral wall of the transfer chamber. The system is completed by setting the transfer arm in the transfer chamber. The transfer arm has a minimum radius of rotation such that it can rotate in the transfer chamber and a maximum arm reach such that each wafer can be transferred from the transfer chamber into the vacuum process chambers and the load-lock chambers.

In order to construct a multi-chamber treatment system in which the number of vacuum process chambers varies with the change of processes, therefore, the transfer chamber should naturally be remade for a shape and size suited for the arrangement. It is necessary, however, to remake the load-lock chambers so that they can be connected to the transfer chamber, and to assemble the transfer chamber with the minimum radius of rotation and maximum arm reach suited for the transfer chamber. In other words, the transfer chamber, transfer arm, and load-lock chambers, which constitute the transportation system, must all be remade and assembled for each process at a user's request, so that the design and manufacture of the transportation system entail troublesome operations and increase in cost on each occasion.

In using the multi-chamber treatment system thus constructed for each process, moreover, it is necessary to move the transfer arm in the transfer chamber and teach and store a program control unit with an object transportation route and distance, since the vacuum process chambers vary in shape and size. These operations are troublesome, and triggering the system operation requires much time.

As is generally known, the manufacture of semiconductors requires many processes, and some other treatment processes are executed before and after a reduced-pressure treatment.

In many cases, a treatment in a reduced-pressure treatment apparatus requires, as its pre- or post-treatment, a so-called normal-pressure treatment which is conducted under atmospheric pressure. In some cases, for example, a treatment in a reduced-pressure ambient gas may be preceded by a cleaning process for removing impurities, which are caused to adhere to the object surface in the preceding treatment process, and a drying process.

Usually, in the cleaning and drying processes, a plurality of wafers in each cassette are batch-processed simultaneously by means of cleaning and drying devices. Then, the cleaned and dried wafers are handled in each cassette and transferred from the cleaning and drying devices into the reduced-pressure treatment apparatus.

The cleaning and drying devices for the aforesaid pre-treatment are separated spatially and temporally from the reduced-pressure treatment apparatus for the post-treatment. Accordingly, a time interval for transportation, standby, etc. is required between the pre- and post-treatments. Although the to-be-treated objects are cleaned and dried with trouble, therefore, impurities in the atmosphere will inevitably adhere to the object surface. Conventionally, in other words, the reduced-pressure treatment in the next stage cannot be started without changing the state immediately after the normal-pressure treatment.

Depending on the kind of the normal-pressure treatment, moreover, the semiconductor wafers may be treated one by one in sheet form, so that normal-pressure sheet-form treatments may possibly increase with the development of finer treatments. In this case, the handling frequency for wafers to be loaded into and unloaded from each cassette increases. If the handling frequency increases in the course of a series of semiconductor manufacturing processes, problems are aroused including lowering of the yield by dusting which is attributable to mechanical contact with the wafers, as well as reduction of the throughput and waste of driving energy.

SUMMARY OF THE INVENTION

A first object of the present invention is to provide a multi-chamber treatment system, in which the kind or order of a plurality of processes can be altered by changing the shape and size of a transfer chamber only, that is, other components, such as load-lock chambers, transfer arm, etc., can be used in common, so that the manufacture and assembling of the system are very easy, ensuring a reduction in cost.

A second object of the invention is to provide a multi-chamber treatment system, in which the kind or order of a plurality of processes can be altered by only supplying a control device with information for the number of changed vacuum process chambers and information for a changed transfer chamber.

A third object of the invention is multi-chamber treatment system, in which a time interval between reduced- and normal-pressure treatments is shortened when the normal-pressure treatment is conducted as a pre- or post-treatment for the reduced-pressure treatment, that is, the normal-pressure treatment is carried out immediately before or after the reduced-pressure treatment, so that the treatment quality and throughput can be improved.

In order to achieve the first object, according to a first aspect of the present invention, there is provided a multi-chamber treatment system comprising:

a plurality of vacuum process chambers for a plurality of processes arranged in a ring;

a substantially polygonal transfer chamber located in the center among the vacuum process chambers and communicating with each vacuum process chamber by means of gate means;

at least one load-lock chamber communicating with the transfer chamber by means of gate means;

a rotatable contractible transfer arm, having a hand portion for holding an object to-be-treated, located in the transfer chamber and adapted to fetch the object to-be-treated from the load-lock chamber, carry the object into the individual vacuum process chambers, and take out and return the treated object from the vacuum process chambers to the load-lock chamber, wherein the vacuum process chambers are increased or decreased in number when the kind or order of the processes is changed, and the shape and size of the transfer chamber are changed with the increase or decrease of the vacuum process chambers in number, the length of the transfer arm is changed with the shape and size of the transfer chamber, without entailing any change in the load-lock chamber and the transfer arm except the hand portion, when the length of the hand portion is changed, said transfer arm having a minimum radius of rotation such that the arm can rotate in a transfer chamber of a minimum size corresponding to a minimum number of vacuum process chambers and a maximum arm reach such that the arm can deliver the object to-be-treated between each vacuum process chamber and a transfer chamber of a maximum size corresponding to a maximum number of vacuum process chambers.

Thus, even though the number of the vacuum process chambers are increased or decreased with the change of the processes, it is necessary only that the shape and size of the transfer chamber and the length of the hand portion be changed, and the other components, such as the load-lock chamber, transfer arm except the hand portion, etc., can be used in common, so that the manufacture and assembling of the system are very easy, ensuring a reduction in cost.

The multi-chamber treatment system further comprises an alignment mechanism situated in a fixed position which never interferes with the rotation and extension or contraction of the transfer arm in the transfer chamber and used to receive and align the object to-be-treated from the transfer arm. Thus, the alignment mechanism, unlike one in the load-lock chamber, never interferes with the transfer arm, and one alignment mechanism can be used in common for a plurality of load-lock chambers, so that the system can be reduced in size.

In order to achieve the second object, according to a second aspect of the invention, moreover, the multi-chamber treatment system further comprises transfer arm control means previously stored with the route and distance of transfer of the object to-be-treated, and the control means is supplied with information for the number of changed vacuum process chambers and information for the changed transfer chamber when the kind or order of the processes is changed. Thus, the transfer arm can be immediately controlled with accuracy by only supplying the control means with the information for the number of the changed vacuum process chambers and the information for the changed transfer chamber and the information for the length of the hand portion.

In order to achieve the third object, according to a third aspect of the invention, furthermore, there is provided a multi-chamber treatment system comprising:

a plurality of reduced-pressure process chambers for subjecting an object to-be-treated to reduced-pressure treatments;

a reduced-pressure transfer chamber connected to the reduced-pressure process chambers by means of a first gate device so that the object to-be-treated is transported under reduced-pressure;

a load-lock chamber connected to the reduced-pressure transfer chamber by means of a second gate device and communicating with the atmosphere by means of a third gate device;

first transportation means located in the reduced-pressure transfer chamber and adapted to deliver the object to-be-treated into and from each of the reduced-pressure process chambers and the load-lock chamber;

a container stored with a plurality of objects to-be-treated under pressure not lower than normal pressure;

a normal-pressure process treatment unit for treating the object to-be-treated before the transfer into or after the transfer from the load-lock chamber under pressure not lower than normal pressure; and second transportation means for delivering the object to-be-treated into and from the load-lock chamber and the normal-pressure process treatment unit under pressure not lower than normal pressure.

The object to-be-treated is transferred from the normal-pressure process treatment unit, which is connected to the reduced-pressure process chambers through the load-lock chamber, into the reduced-pressure process chambers. Thus, a time interval between a reduced-pressure treatment and a normal-pressure treatment as a pre- or post-treatment is shortened considerably. Since the normal-pressure treatment can be carried out when the object to-be-treated is handled as it is loaded into or unloaded from a container such as a cassette, the handling frequency can be lowered.

BRIEF DESCRIPTION OF THE DRAWINGS

FIG. 1 is a horizontal sectional view of a multi-chamber treatment system with three vacuum process chambers according to a first embodiment of the present invention;

DETAILED DESCRIPTION OF THE PREFERRED EMBODIMENTS

Figure 2:
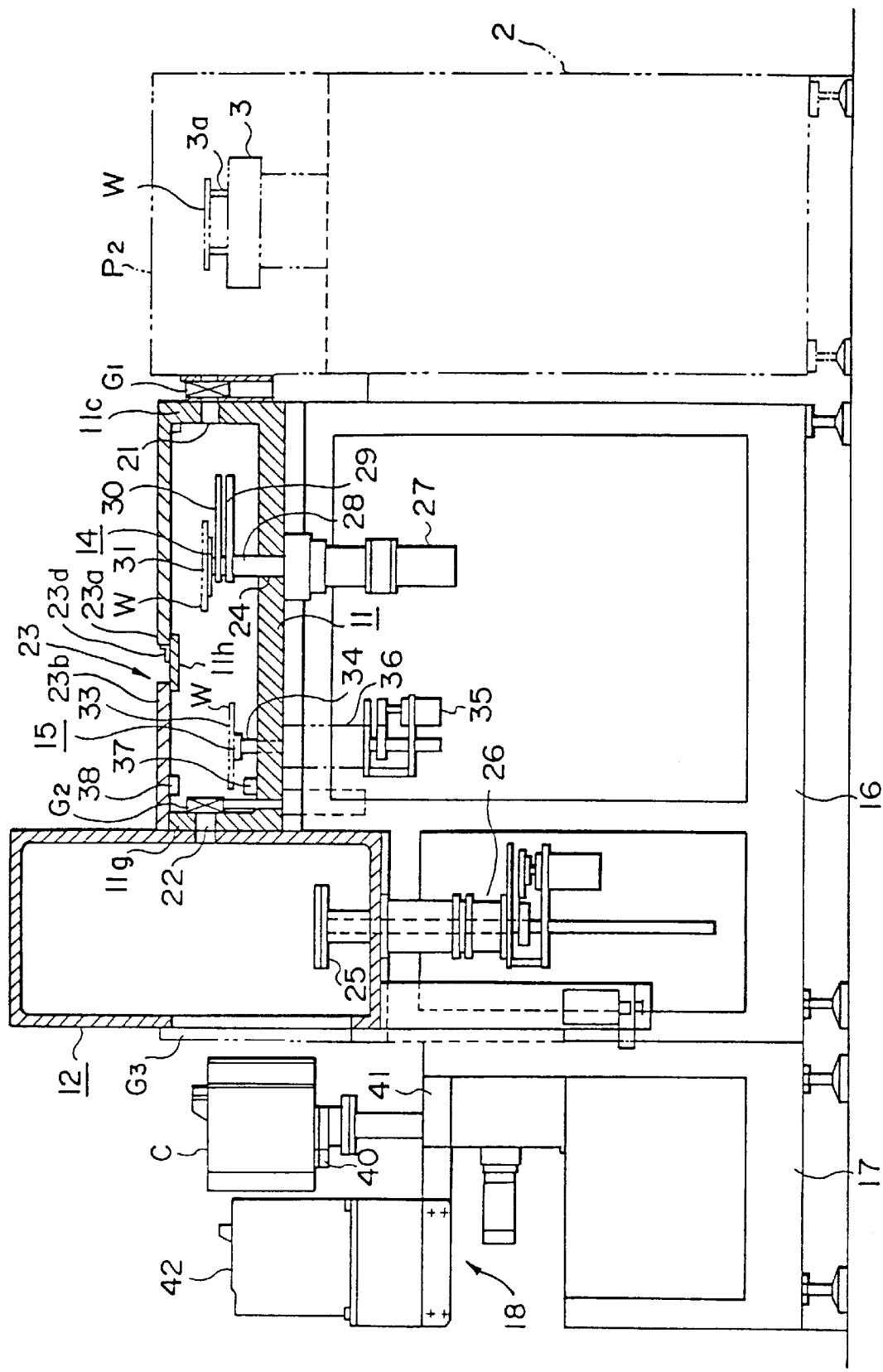
FIG. 2 is a longitudinal sectional view taken along line II—II of FIG. 1.
Figure 3A:
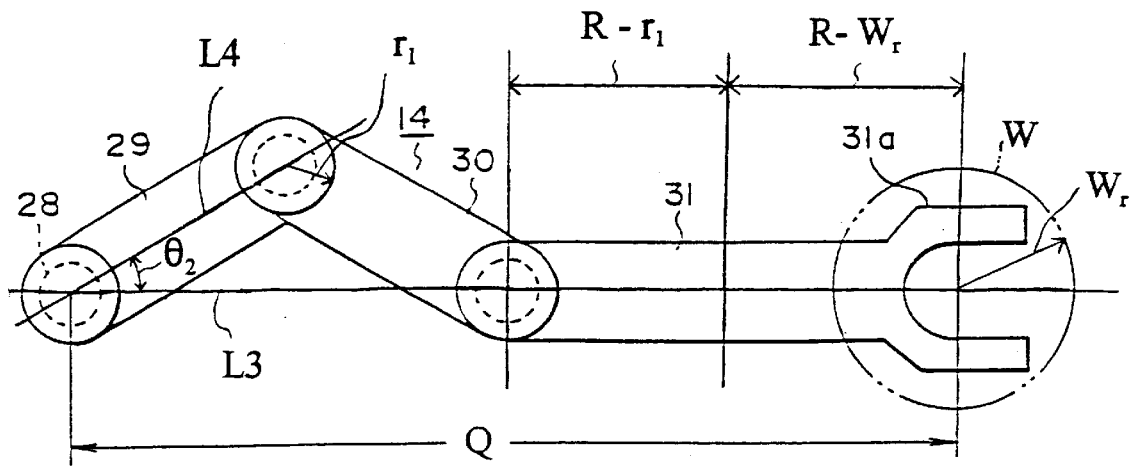
FIG. 3A is a plan view showing a transfer arm of a transportation apparatus in an extended state and also showing parameters of the transfer arm.
Figure 3B:
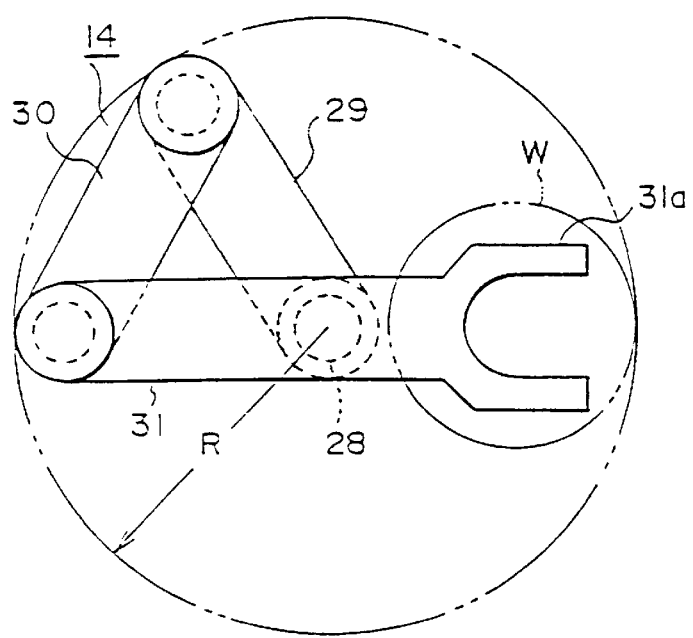
FIG. 3B is a plan view showing the transfer arm in a contracted state.
Figure 4:
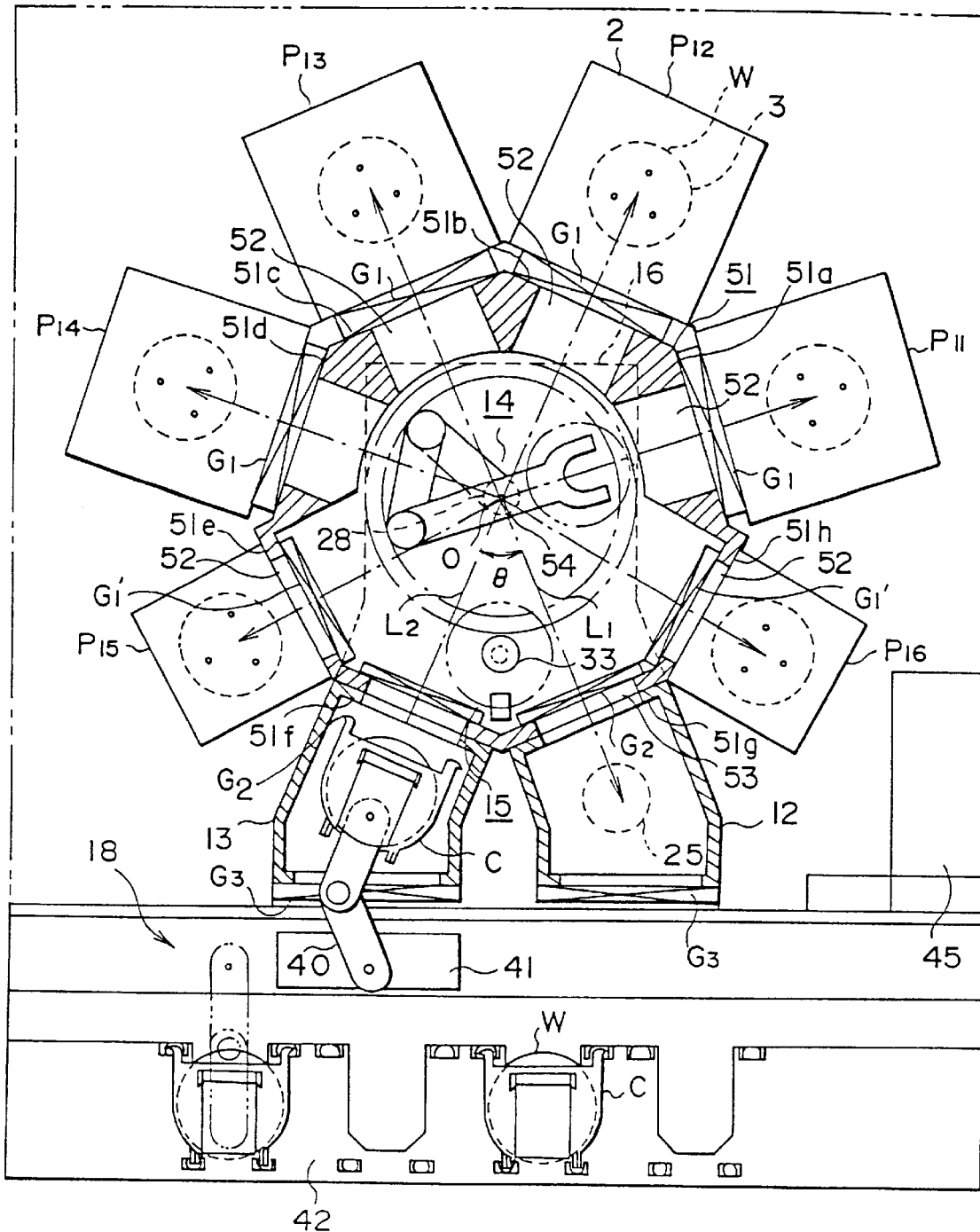
FIG. 4 is a horizontal sectional view of a multi-chamber treatment system with six vacuum process chambers according to a second embodiment of the invention.

Preferred embodiments of the present invention will become understood from the following detailed description referring to the accompanying drawings. FIG. 1 is a horizontal sectional view of a multi-chamber treatment system with three vacuum process chambers according to a first embodiment of the present invention. FIG. 2 is a longitudinal sectional view taken along line II—II of FIG. 1. FIGS. 3A and 3B are plan views showing extended and contracted states, respectively, of a transfer arm used in a transportation apparatus. FIG. 4 is a horizontal sectional view of a multi-chamber treatment system with six vacuum process chambers.

Referring first to FIGS. 1 to 3, there is shown the multi-chamber treatment system which is provided with three vacuum process chambers P1, P2, and P3 for treating semiconductor wafers (hereinafter referred to simply as wafers) W with a radius of $W_r$ as objects to-be-treated, for example. As shown in FIGS. 1 and 2, the vacuum process chambers P1, P2, and P3 are formed of rectangular parallelepiped airtight containers called process chambers or the like, which are mounted individually on stands 2 with a predetermined height. Each process chamber contains therein a susceptor 3 which has a plurality of lift/support pins 3a for holding a wafer W to be treated.

The two vacuum process chambers P1 and P2, out of the three, have treatment functions selected among necessary functions for the wafers W, such as sputtering, CVD, etching, ashing, oxidation, diffusion, etc. The remaining vacuum process chamber P3 is a spare vacuum process chamber for pretreatment and post-treatment cooling of the wafers W. For their respective purposes, these vacuum process chambers are furnished with a vacuum suction mechanism, process gas injection mechanism, heating/cooling mechanism (not shown), etc.

In general, these three vacuum process chambers P1, P2, and P3 are supposed to be a minimum unit or pattern which constitutes the multi-chamber treatment system of this type.

A transportation apparatus for the multi-chamber treatment system with the minimum pattern includes a polygonal transfer chamber 11 surrounded by the three vacuum process chambers P1, P2, and P3 in three directions, two load-lock chambers 12 and 13 connected to the front end portion of the transfer chamber 11, a rotatable contractible transfer arm 14, and an alignment mechanism 15. The transfer arm 14, which is housed in the transfer chamber 11, fetches the wafers W from the load-lock chambers 12 and 13, carries them into the vacuum process chambers PI, P2, and P3, then fetches the treated wafers W from the process chambers, and then restores them to the load-lock chambers 12 and 13. The alignment mechanism 15 temporarily receives the wafers W from the transfer arm 14 and aligns them in a manner described later.

As shown in FIG. 2, the transfer chamber 11 and the load-lock chambers 12 and 13 are supported on a fixed stand 16. An external cassette transportation apparatus 18 is located on the front side of the chambers 12 and 13 with the aid of a stand 17. The vacuum pressure chambers P1, P2, and P3 are supported by stands 2.

The transfer chamber 11, which is polygonal in shape, is referred to also as a vacuum transfer chamber, and has right and left-hand parallel wall portions 11a and 11b and a rear end wall portion 11c which extends at right angles to the parallel wall portions, as shown in FIGS. 1 and 2. Also, the transfer chamber 11 has left- and right-hand spread wall portions 11d and 11e, which extend slightly spreading forward from the parallel wall portions 11a and 11b, and front end wall portions 11f and 11g which are continuous with the respective ends of their corresponding spread wall portions and form a V angle. Further, the transfer chamber 11 includes a beam 11h for supporting a lid 23 as described later. Moreover, the transfer chamber 11 has a minimum size which is suited for a pattern treatment system with a minimum number of three vacuum process chambers so that waste of the installation space can be minimized. Thus, this transfer chamber 11 is smaller than that of another pattern treatment system which will be described later.

A junction port 21 is formed in each of the right- and left-hand wall portions 11a and 11b and the rear end wall portion 11c of the transfer chamber 11. The vacuum process chambers P1, P2, and P3 are arranged outside the transfer chamber 11 so as to communicate with their corresponding junction ports 21 by means of gate valves G1, individually. The front end wall portions 11f and 11g serve as interfaces to be connected to the two load-lock chambers 12 and 13, and are formed with their respective junction ports 22. The load-lock chambers 12 and 13 are arranged side by side in front of the junction ports 22, individually, in a manner such that they communicate internally with the transfer chamber 11 by means of their corresponding gate valves G2, with their respective rear end ports connected to the junction ports 22.

Normally, the transfer chamber 11 is an airtight container having a lid 23 thereon, as shown in FIG. 2. The lid 23 is composed of two divisions 23a and 23b. The one division 23a is rotatable by means of hinge means 23d, while the other division 23b is rotatable by means of screws or the like. Thus, the lid 23 can be reduced in size, and can be put on and taken off very easily. In the present embodiment, the division 23b can be used as a common component even in case the transfer chamber 11 is modified. The transfer chamber 11 is furnished with a vacuum suction mechanism (not shown) for keeping the chamber 11 in a desired vacuum state or a gas supply mechanism (not shown) for replacing the gas in the chamber 11 with an inert gas such as $N_2$ gas.

Further, the base plate of the transfer chamber 11 is formed with a pivot hole 24 for the transfer arm 14, which is situated in an imaginary center at equal distances from the right- and left-hand wall portions 11a and 11b and the rear end wall portion 11c. A pivot 28 (discussed later) of the transfer arm 14 is fitted in the hole 24.

The two load-lock chambers 12 and 13 have respectively transfer ways (center lines) which are each in the form of a bent duct extending in the longitudinal direction of the system, and are formed symmetrically with each other about the longitudinal direction. The respective rear ends of the chambers 12 and 13 are connected to the front end wall portions 11g and 11f which serve as the load-lock chamber interfaces of the transfer chamber 11. The load-lock chambers 12 and 13 are arranged symmetrically at a suitable angle θ (e.g., 45°) to each other in a manner such that their respective center lines L1 and L2 are directed to a pivot center 0 of the transfer arm 14 in the transfer chamber 11.

The three vacuum process chambers P1, P2, and P3 and the load-lock chambers 12 and 13 are arranged around the transfer chamber 11 so as to be connected thereto and situated on radial lines which extend straight from the pivot center 0 of the transfer arm 14. The wafers W can be transferred to and from each of these chambers by means of the transfer arm 14.

As shown in FIGS. 1 and 2, each of the load-lock chambers 12 and 13 has a cassette stand 25 in the center. A cassette C, which contains a plurality of wafers W, e.g., 25 wafers, in a horizontal state, is transferred to and from the cassette stand 25. The cassette transportation apparatus 18 comprises a handling arm 40 for supporting the cassette C, a moving mechanism 41 for moving the arm 40 horizontally, and a cassette holder 42 for storing a plurality of cassettes C. In this arrangement, the handling arm 40, supporting one of the cassettes C, is moved to a predetermined position by means of the moving mechanism 41 and driven again, whereupon the cassette C is placed on the cassette stand 25. Each cassette C stored with treated wafers is returned from the load-lock chamber to the cassette holder 42, following the aforementioned steps in a reverse manner. The cassette stand 25 in each of the load-lock chambers 12 and 13 is supported so that it can be lifted or lowered by means of a lift mechanism (elevator) 26 which is attached to the lower part of each load-lock chamber.

Further, as shown in FIG. 1, the load-lock chambers 12 and 13 have their respective gate valves G3 at their front end port portions or cassette inlets such that they are opened and closed by means of the valves. Thus, the chambers 12 and 13 can be kept airtight. Moreover, the load-lock chambers 12 and 13 can be isolated from the outside ambient gas by being evacuated by means of a vacuum suction mechanism or filled with an inert gas, such as $N_2$ gas, by means of a gas supply mechanism (not shown).

As shown in FIG. 2, the transfer arm 14, which is a transfer robot, has the pivot 28 rising from the lower part of the transfer chamber 11 on a drive unit 27 which is supported on the stand 16, as shown in FIG. 2. The pivot 28 upwardly penetrates the pivot hole 24 in the imaginary center of the transfer chamber 11 in an airtight manner. As shown in FIGS. 3A and 3B, a series of multi-joint arms 29, 30 and 31 is connected to the upper end of the pivot 28, and a substantially U-shaped hand portion 31a for holding each wafer W with the aid of electrostatic adsorbing means is attached to the distal end of the arm 31.

As shown in FIGS. 3A and 3B, the transfer arm 14 is designed so that its minimum radius R of rotation obtained in a contracted state such that the multi-joint arms 29, 30, and 31 are folded up together is a little shorter than the inside radius of the minimum-size transfer chamber 11 which corresponds to a minimum number of three vacuum process chambers. As shown by a imaginary line in FIG. 1, the inside radius of the minimum-size transfer chamber 11 may be adjusted to either the distance from the pivot center 0 to the inner surface of the peripheral wall or the distance from the center 0 to the inner part of each junction port 21, according to the length. As the drive unit 27 is actuated, the multi-joint arms 29, 30, and 31 can horizontally turn around the pivot 28 in the transfer chamber 11 in a manner such that the wafer W is held on the distal hand portion 31a, and can extend or contract to deliver the wafer W into or from the vacuum process chambers P1, P2, and P3 and the load-lock chambers 12 and 13.

As shown in FIG. 2, the alignment mechanism 15 includes a rotating carriage 33, rotation drive section 35, lift drive section 36, light emitting section 37, light sensing section 38 formed of, for example, a PIN photodiode, and control section (not shown). The rotating carriage 33 temporarily receives individual wafers W one by one from the transfer arm 14 in the transfer chamber 11 and holds them by means of electrostatic adsorbing means. The rotation drive section 35 rotates the rotating carriage 33 around a rotating shaft 34, while the lift drive section 36 causes the carriage 33 to ascend and descend. The light emitting section 37, for example, applies a laser beam in the form of a parallel light beam to the rotational position of the peripheral edge portion of each wafer W on the rotating carriage 33 from right under the same. The light sensing section 38 receives the laser beam above and outputs an electrical signal corresponding to the light sensing area. The control section detects the center position of each wafer W and the direction of its orientation flat in accordance with the electrical signal from the light sensing section 38, and controls the rotation drive section 35 when the wafer W is caused to make one revolution. As the rotation is controlled in this manner, the wafers W are, as shown in FIG. 1, aligned for orientation and transferred to the transfer arm 14 so that they can be properly set in the vacuum process chambers P1, P2, and P3.

As shown in FIG. 1, in the minimum-size transfer chamber 11 which corresponds to the minimum number of vacuum process chambers, the alignment mechanism 15 is set in a fixed position such that it never interferes with the rotation and extension or contraction of the transfer arm 14. More specifically, the rotating carriage 33 is mounted on the rotating shaft 34 so as to be situated just outside the minimum radius R of rotation of the transfer arm 14 in the transfer chamber 11 and halfway between the respective center lines L1 and L2 of the two load-lock chambers 12 and 13 which are arranged at the suitable angle θ to each other, as previously discussed.

In FIG. 1, a control unit 45, which is the control means, includes a control device such as a CPU having a memory stored with programs for various operation modes and a control panel used to select the programs and to set conditions.

The following is a description of the operation of the multi-chamber treatment system constructed in this manner.

As shown in FIGS. 1 and 2, when the cassette C, which is stored with a predetermined number of wafers W for use as to-be-treated objects, is loaded into the external cassette transportation apparatus 18, the apparatus 18 is first actuated to carry the cassette C into the load-lock chamber 12 or 13, whichever may be open, in a manner such that various parts are controlled automatically by the control device of the control unit 45. Then, the cassette stand 25 in the load-lock chamber 12 or 13 is raised by the lift mechanism 26 and receives the cassette C, whereupon the transportation apparatus 18 returns forward.

As shown in FIG. 1, therefore, the left-hand load-lock chamber 13 having the cassette C therein, for example, is sealed with its front end port closed by the gate valve G3. In this state, the chamber 13 isolated from the outside ambient gas (or load-locked) by being evacuated by means of the vacuum suction mechanism and filled with the inert gas, such as N₂ gas, by means of the gas supply mechanism. Thereafter, the gate valve G2 on the rear end side of the load-lock chamber 13 opens, so that the chamber 13 internally communicates with the transfer chamber 11 which is evacuated and filled with the inert gas.

In this state, as shown in FIGS. 1 and 2, the cassette C in the load-lock chamber 13, along with the cassette stand 25, is lifted or lowered by the lift mechanism 26, while the transfer arm 14 in the transfer chamber 11 rotates and extends or contracts, thereby delivering the wafers W one after another from the cassette C in the load-lock chamber 13 into the transfer chamber 11. Then, the wafers W are successively set in the necessary vacuum process chambers P1, P2, and P3 in accordance with the program mode in a manner such that the gate valve G1 of each process chamber is opened on each occasion, and predetermined treatments are carried out.

More specifically, as shown in FIGS. 1 and 2, each wafer W is first carried into the spare vacuum process chamber P3 by means of the transfer arm 14 and is preheated therein.

Then, the wafer W is returned to the transfer chamber 11, and the rotating carriage 33 ascends and receives the wafer W. Thereupon, the control section detects the center of the wafer W and the direction of its orientation flat, and aligns the wafers W for orientation. As the rotating carriage 33 descends in this state, the wafer W is transferred to the transfer arm 14, and is set in the vacuum process chambers P1 and P2 in succession, whereupon it is subjected to a predetermined treatment, such as filming or etching. The transfer arm 14 returns the treated wafer W to the cassette C in the load-lock chamber 13.

As shown in FIG. 1, when all the wafers W in the cassette C are treated one after another in this manner, the gate valve G2 on the rear end side of the load-lock chamber 13 is closed, and after the pressure in the chamber 13 is restored to the atmospheric pressure, the gate valve G3 attached to the front end port then opens. Then, the external cassette transportation apparatus 18 comes and takes out the cassette C which contains the treated wafers W.

As shown in FIG. 1, while the wafers W are being treated in the vacuum process chambers P1, P2, and P3 after being successively introduced from the cassette C in the left-hand load-lock chamber 13 into the transfer chamber 11, another cassette C stored with untreated wafers W is carried into the right-hand load-lock chamber 12 by means of the external cassette transportation apparatus 18, and the right-hand chamber 12 is left on standby in a load-lock state. The moment the transfer to and from the left-hand load-lock chamber 13 is finished, the gate valve G2 of the right-hand load-lock chamber 12 is opened, so that the transfer arm 14 fetches the wafers W from the second cassette C in the chamber 12 into the transfer chamber 11. Thereupon, the treatment can be carried out continuously.

The following is a description of a multi-chamber treatment system according to a second embodiment, which is provided with six vacuum process chambers P11, P12, P13, P14, P15, and P16, as shown in FIG. 4.

For simplicity of illustration, like reference numerals are used to designate like portions which have the same constructions and functions as their counterparts in the embodiment shown in FIGS. 1 to 3. The second embodiment substantially shares the arrangements shown in FIGS. 2 and 3 with the first embodiment. With respect to those arrangements, therefore, the second embodiment will be described with reference to FIGS. 2 and 3.

First, the six vacuum process chambers P11 to P16 are rectangular parallelepiped airtight containers mounted individually on stands 2 which resemble those of the foregoing embodiment. The four vacuum process chambers P11, P12, P13, and P14, out of the six, have treatment functions selected among necessary functions for the wafers W, such as sputtering, CVD, etching, ashing, oxidation, diffusion, etc. The two remaining vacuum process chambers P15 and P16 are spare vacuum process chambers for pretreatment and post-treatment, e.g., heating and cooling of the wafers W.

In general, these six vacuum process chambers P11 to P16 are supposed to be a maximum unit number or pattern which constitutes the multi-chamber treatment system of this type. A transportation apparatus for the multi-chamber treatment system with the maximum pattern includes a polygonal transfer chamber 51 connected with the six vacuum process chambers P11 to P16 which are arranged radially. Like the one according to the first embodiment, the transportation apparatus further comprises two load-lock chambers 12 and 13, a transfer arm 14, and an alignment mechanism 15. As in the arrangement shown in FIG. 2, moreover, the system is provided with a fixed stand 16 for supporting the transfer chamber 51 and the load-lock chambers 12 and 13 and an external cassette transportation apparatus 18 on the front side of the chambers 12 and 13.

The transfer chamber 51 is in the form of a substantially octagonal container which includes peripheral wall portions 51a, 51b, 51c, 51d, 51e, 51f, 51g, and 51h and has a suitable outside diameter such that the six vacuum process chambers P11 to P16 and the two load-lock chambers 12 and 13 can be arranged radially as close as possible without interfering with one another and with good balance. Naturally, the transfer chamber 51 has a maximum size such that it is larger than the transfer chamber 11 of the multi-chamber treatment system according to the foregoing embodiment which has three vacuum process chambers or that of a medium-size pattern treatment system (not shown) which has four or five vacuum process chambers.

A junction port 52 is formed in each of the peripheral wall portions 51a to 51h of the transfer chamber 51. The vacuum process chambers P11 P12, P13, and P14 are arranged outside the rear-side peripheral wall portions 51a, 51b, 51c, and 51d, respectively, so as to communicate with them by means of gate valves G1, individually. The spare vacuum process chambers P15 and P16 communicate with the left- and right-hand peripheral wall portions 51e and 51h on the front side by means of individual gate valves G1'.

Further, the left- and right-hand peripheral wall portions 51f and 51g on the front-end side are arranged in the form of a V at the same angle as in the foregoing embodiment, and are each formed with a junction port 53. Also in this large-sized octagonal transfer chamber 51, load-lock chamber interfaces with just the same size as those of the first embodiment are formed on the front-end side, and the two load-lock chambers 12 and 13 are arranged side by side in front of the interfaces in a manner such that they communicate internally with the transfer chamber 51 by means of their corresponding gate valves G2, with their respective rear end ports connected to the interfaces. More specifically, the load-lock chambers 12 and 13, which have just the same construction as those of the foregoing embodiment, are arranged symmetrically at a suitable angle θ (e.g., 45°) to each other in a manner such that their respective center lines L1 and L2 are directed to a pivot center 0 of the transfer arm 14 in the transfer chamber 51, just as in the first embodiment.

A pivot hole 54 is formed in the center of the octagonal base plate of the transfer chamber 51, and the transfer arm 14 is mounted on a pivot 28 which airtightly penetrates the pivot hole 54 in the same manner as in the foregoing embodiment.

The six vacuum process chambers P11 to P16 and the two load-lock chambers 12 and 13 are arranged around the transfer chamber 51 so as to be connected thereto and situated on radial lines which extend straight from the pivot center O of the transfer arm 14. The wafers W can be transferred to and from each of these chambers by means of the transfer arm 14.

A lid 23 of the transfer chamber 51, like the one shown in FIG. 2, is composed of two divisions.

Since the transfer arm 14 is designed as a common component, its minimum radius R of rotation obtained in a contracted state such that its multi-joint arms 29, 30, and 31 are folded up together is a little shorter than the inside radius of the minimum-size transfer chamber 11 which corresponds to the minimum number of vacuum process chambers. In the maximum-size octagonal transfer chamber 51, therefore, the space for rotation is so large that the peripheral wall portions 51a, 51b, 51c and 51d of the transfer chamber 51 can be thickened to improve the strength of the chamber 51 in a vacuum.

As mentioned before, the minimum radius R of rotation of the transfer arm 14 with its multi-joint arms 29, 30, and 31 contracted is short. The radius of an individual joint is $r_1$. However, a maximum arm reach Q of the multi-joint arms 29, 30, and 31 is adjusted to a length (distance from the pivot center O to the stand 2 of the vacuum process chamber P11) necessary for the wafer W to be transferred between the maximum-size transfer chamber 51 and the vacuum process chambers P11 to P16 and the load-lock chambers 12 and 13. The transfer arm 14 has a minimum opening angle $\theta_2$ between the transfer arm center line L3 and the center line of the multi-joint arms L4. The minimum radius R then is determined by the equation $$R = \frac{Q + 2r_1(\cos\theta_2) + r_1 + W_r}{2\cos\theta_2 + 2},$$

if the transfer arm is fully extended, by $$R = \frac{Q + 3r_1 + W_r}{4}.$$

The maximum arm reach Q may seem too long for the minimum-size transfer chamber 11 of the multi-chamber treatment system with three vacuum process chambers according to the first embodiment or for the medium-size pattern treatment system (not shown) with four or five vacuum process chambers. In consideration of the trouble of designing and manufacturing transfer arms with different arm reaches in accordance with various sizes of the transfer chambers, however, use of a common transfer arm with the same construction is very profitable. Since the transfer arm 14 has a long arm reach, moreover, even the small-sized transfer chamber 11 according to the first embodiment can enjoy a long distance between the pivot center O and each load-lock chamber junction (interface), so that a wide enough installation space can be secured for the alignment mechanism 15.

The alignment mechanism 15 is constructed just in the same manner as the one according to the first embodiment. Thus, a rotating carriage 33 of the mechanism 15 is mounted on a rotating shaft 34 so as to be situated just outside the minimum radius R of rotation of the transfer arm 14 in the transfer chamber 51 and halfway between the respective center lines L1 and L2 of the two load-lock chambers 12 and 13 which are arranged at the suitable angle θ to each other, as mentioned before.

In the transportation apparatus of the multi-chamber treatment system according to the embodiment shown in FIG. 4, basically the same functions of the transportation apparatus according to the embodiment shown in FIGS. 1 to 3 can be obtained, and the number of the vacuum process chambers P11 to P16 is so large that the wafers W can undergo a variety of processes.

In the multi-chamber treatment systems according to the above-described embodiments of the present invention, the shape and size of the transfer chamber are changed with the increase or decrease of the number of the vacuum process chambers as the semiconductor manufacturing processes are modified from system to system. These systems share the following components: load-lock chambers 12 and 13, transfer arm 14, and alignment mechanism 15.

As mentioned before, therefore, the load-lock chambers 12 and 13 of the same construction can be arranged in the same manner by using the junctions which are fixed at the peripheral wall end portions with respect to the load-lock chambers, without regard to the size of the transfer chamber. Besides, the transfer arm 14 has the minimum radius R of rotation which allows the arm 14 to rotate in the minimum-size transfer chamber corresponding to the minimum number of vacuum process chambers and the maximum arm reach Q which allows the to-be-treated objects to be transferred between the individual vacuum process chambers through the maximum-size transfer chamber 51 which corresponds to a maximum number of vacuum process chambers.

Figure 5:
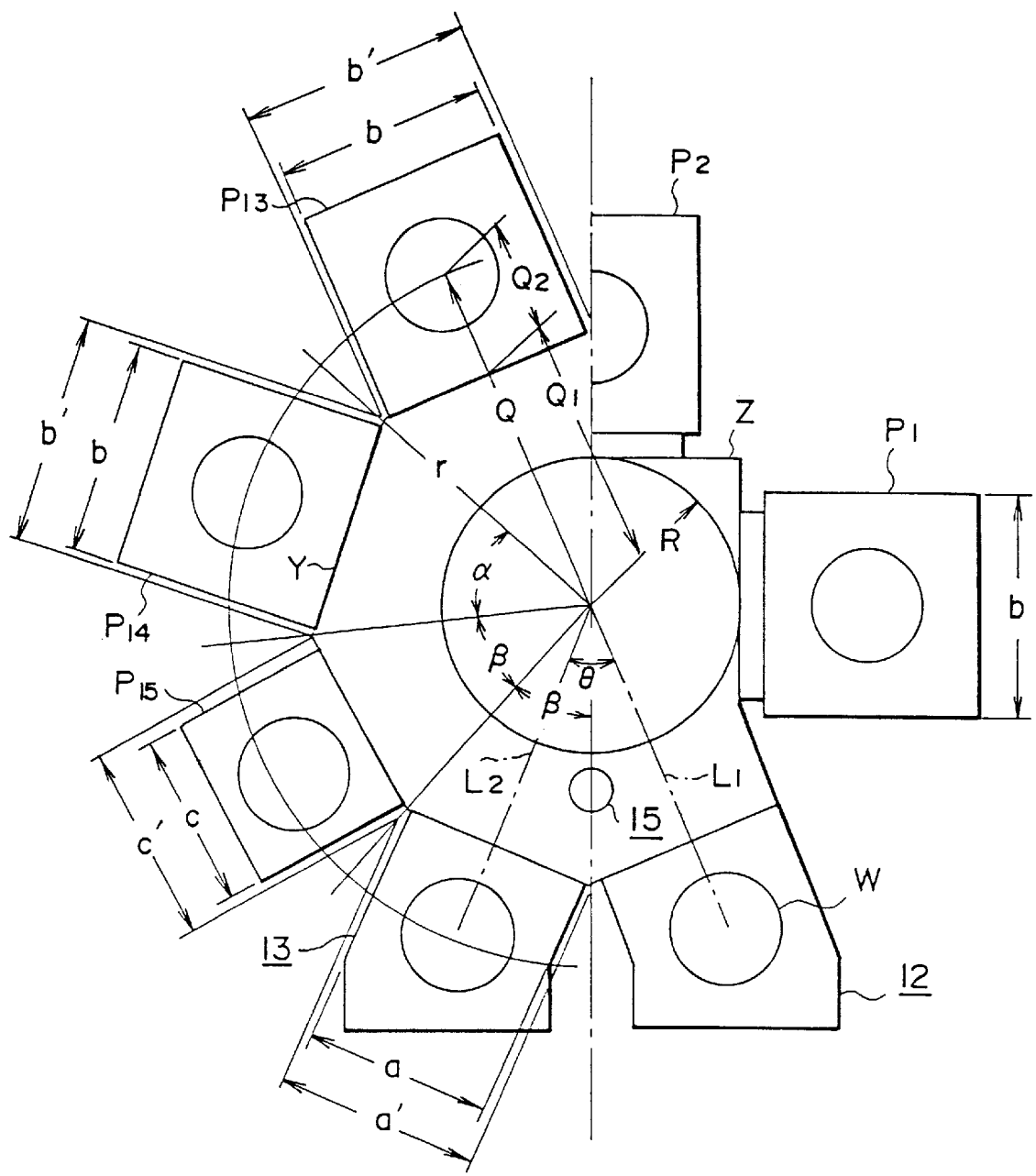
FIG. 5 is a diagram for illustrating the way of designing transportation apparatuses in multi-chamber treatment systems with three and six vacuum process chambers, individually.

The following is a description of a designing method for the above arrangement as shown in FIG. 5. First, as prior conditions, the size (width) a of each load-lock chamber is adjusted to a=300 mm in consideration of the respective sizes of the wafers W (e.g., 8 inches) as the to-be-treated objects and a cassette C containing the 8-inch wafers, the respective sizes (widths) b and c of the various vacuum process chambers P1, . . . for treating the wafers W are adjusted to b=400 mm and c=300 mm, and the necessary installation space for the alignment mechanism 15 is selected in advance, as shown in FIG. 5. Moreover, the number of the vacuum process chambers, minimum three or maximum six, and the number (two) of the load-lock chambers are selected depending on the processes to be performed by the manufactured system.

In a first stage, an octagon Y is drawn such that the six vacuum process chambers and the two load-lock chambers can be radially arranged at as narrow intervals as possible (with an allowance of, e.g., about 10 mm on either side) on the circumference of one circle without interfering with one another, and a distance (radius of a circle which internally touches the octagon) Q1 from the arm pivot center O to each transfer outlet (interface) is calculated.

First, an equation is given as follows:

$$2\alpha + 2\beta = 180°.$$

Then, there are relations $$420^2 = r^2 + r^2 - 2r^2 \cos \alpha,$$

$$320^2 = r^2 + r^2 - 2r^2 \cos \beta,$$

where the respective widths (with the allowance of 10 mm on either side added) of the vacuum process chambers and the load-lock chambers are adjusted to a'=320 mm, b'=420 mm, and c'=320 mm. Thus, we obtain $$\alpha = 51°,$$

$$\beta = 39°,$$

$$r = 484.$$

Accordingly, the distance Q1 from the arm pivot center O to each transfer outlet is given by $$Q1 = r \cos (\alpha/2) = 436 \text{ mm}.$$

Based on this value Q1, the maximum-size octagonal transfer chamber 51 is designed in consideration of the mounting space for the gate valves. The maximum arm reach (maximum transfer distance) Q of the transfer arm 14 is calculated by adding a maximum wafer transfer distance Q2 (=305 mm) in the largest vacuum process chamber to Q1 to obtain Q equal to 741 mm.

In a second stage, the transfer arm 14 of the multi-joint structure is designed with the maximum arm reach Q=741 mm, and the minimum radius R of rotation is obtained. The minimum radius R can be reduced to about 255 mm.

In a third stage, a tetragon Z is drawn such that only those interface portions of the maximum-size transfer chamber 51 which correspond to the two load-lock chambers 12 and 13 are left without any change and that the three vacuum process chambers can be arranged in the remaining peripheral portions at as narrow intervals as possible on the circumference of one circle without interfering with the range of rotation of the transfer chamber, and the minimum-size transfer chamber 11 is designed and manufactured on the basis of this drawing and in consideration of the mounting space for the gate valves.

In a fourth stage, the alignment mechanism 15 is set just outside the minimum radius R of rotation of the transfer arm 14 in the transfer chamber 51 and halfway between the respective center lines L1 and L2 of the two load-lock chambers 12 and 13 which are arranged at the suitable angle θ to each other.

If the transfer arm 14 in the transfer chamber runs against the rotating shaft 34 or the rotating carriage 33 when it delivers the wafers W to and from the load-lock chambers 12 and 13, the angle θ between the respective center lines L1 and L2 of the two load-lock chambers 12 and 13 and the distance from the pivot center O to the interface portion of each load-lock chamber are increased. If this increase requires a change of location of the vacuum process chambers, the apparatus is designed again from the first stage.

In the transportation apparatus for the multi-chamber treatment system designed and manufactured in this manner, if the vacuum process chambers are increased or decreased in number with the change of the processes, it is necessary only that the shape and size of the transfer chambers 11 and 51 in the transportation system be changed. Thus, the load-lock chambers 12 and 13, transfer arm 14, and alignment mechanism 15 can be common components, so that the manufacture and assembling are very easy, entailing reduced costs.

Further, the alignment mechanism 15 can temporarily receive and align the wafers W as the wafers are transferred from the load-lock chambers 12 and 13 into the transfer chamber 11 or 51 by means of the transfer arm 14 and carried into the vacuum process chambers.

With use of the two load-lock chambers 12 and 13, moreover, the wafers W can be smoothly transferred by means of the transfer arm 14, so that the throughput can be improved. Furthermore, the two load-lock chambers 12 and 13 are arranged at the suitable angle θ to each other in a manner such that their respective center lines L1 and L2 are directed to the pivot center O of the transfer arm 14 in the transfer chamber 11 or 51, and the alignment mechanism 15 is located in a space between routes of the transfer arm 14 for the load-lock chambers 12 and 13. Accordingly, the alignment mechanism 15 never hinders the action of the transfer arm 14, and the transfer chambers 11 and 51 can be minimized in size depending on the number of the vacuum process chambers, so that the whole system can be reduced in size.

In the transportation apparatus for the multi-chamber treatment system designed and manufactured in this manner, on the other hand, a control unit 45 as control means including a control device such as a CPU having a memory stored with programs for various operation modes and a control panel used to select the programs and to set conditions. Thus, the transfer arm 14 can be rotated and extended or contracted in accordance with the actually established route and distance of transfer of the to-be-treated objects for each transfer chamber, which is changed in size as the vacuum process chambers are increased or decreased in number with the change of the processes at the time of design, by previously storing the memory with the route and distance. Even though the shape and size of the transfer chamber varies with an increase or decrease in the number of vacuum process chambers, therefore, the route and distance of transfer of the to-be-treated objects by the transfer arm 14 need not be taught on each occasion, and the transfer arm can be properly controlled at once.

Figure 6A:
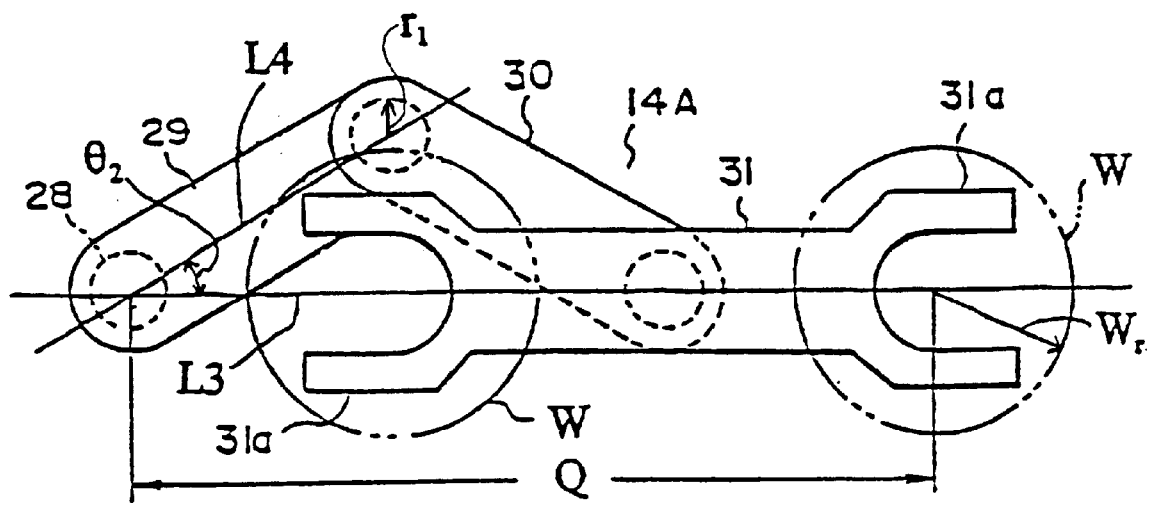
FIG. 6A is a plan view showing a multi-joint arm in an extended state, capable of holding two objects to-be-treated, and also showing parameters of the transfer arm.
Figure 6B:
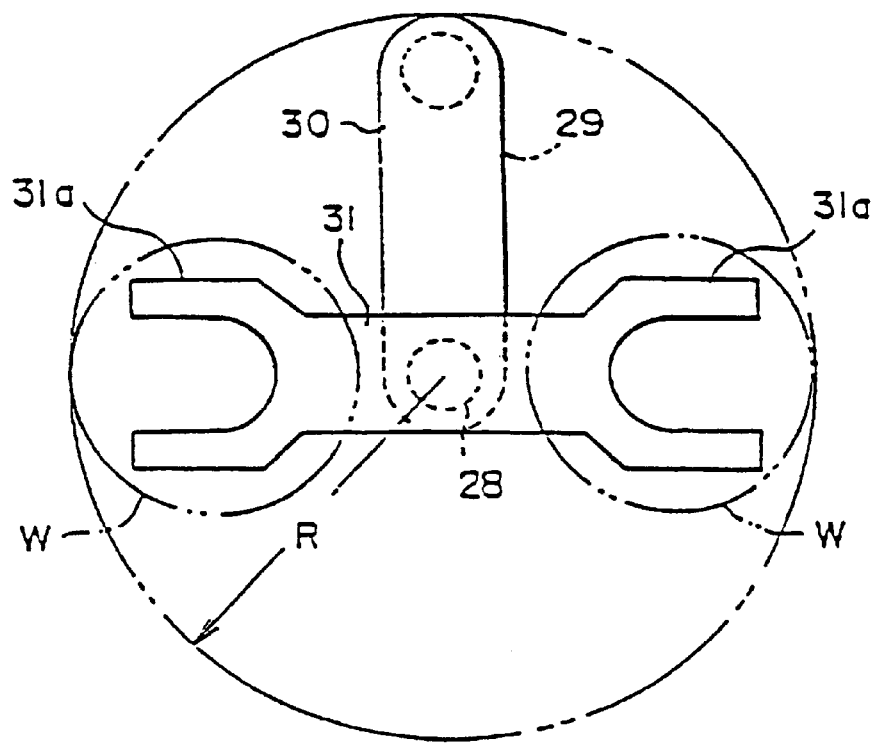
FIG. 6B is a plan view showing the multi-joint arm in a contracted state.

Although the load-lock chambers used in the embodiments described above are two in number, one or three load-lock chambers may be used as required instead. According to the foregoing embodiments, moreover, the multi-joint arm means for holding each object to-be-treated is given as an example of the transfer arm 14. Alternatively, however, a frog-leg arm or a multi-joint arm 14A capable of holding two to-be-treated objects at a time may be used for the purpose, as shown in FIG. 6.

Even though the number of the vacuum process chambers are increased or decreased with the change of the processes, one type of transfer arm can be used in common. The hand portion 31a may be easily exchanged so that a comparatively short hand portion is used for a small transfer chamber and a comparatively long hand portion is used for a large transfer chamber.

The alignment mechanism 15 does not need to be used in a vacuum treatment system which requires no wafer alignment. In the foregoing embodiments, furthermore, the semiconductor wafers W are given as examples of the to-be-treated objects. Alternatively, LCD substrates or the like may be substituted as the objects to-be-treated. It is to be understood that the present invention is not limited to the embodiments described above, and that various changes and modifications may be effected therein by one skilled in the art without departing from the scope or spirit of the invention.

Figure 7:
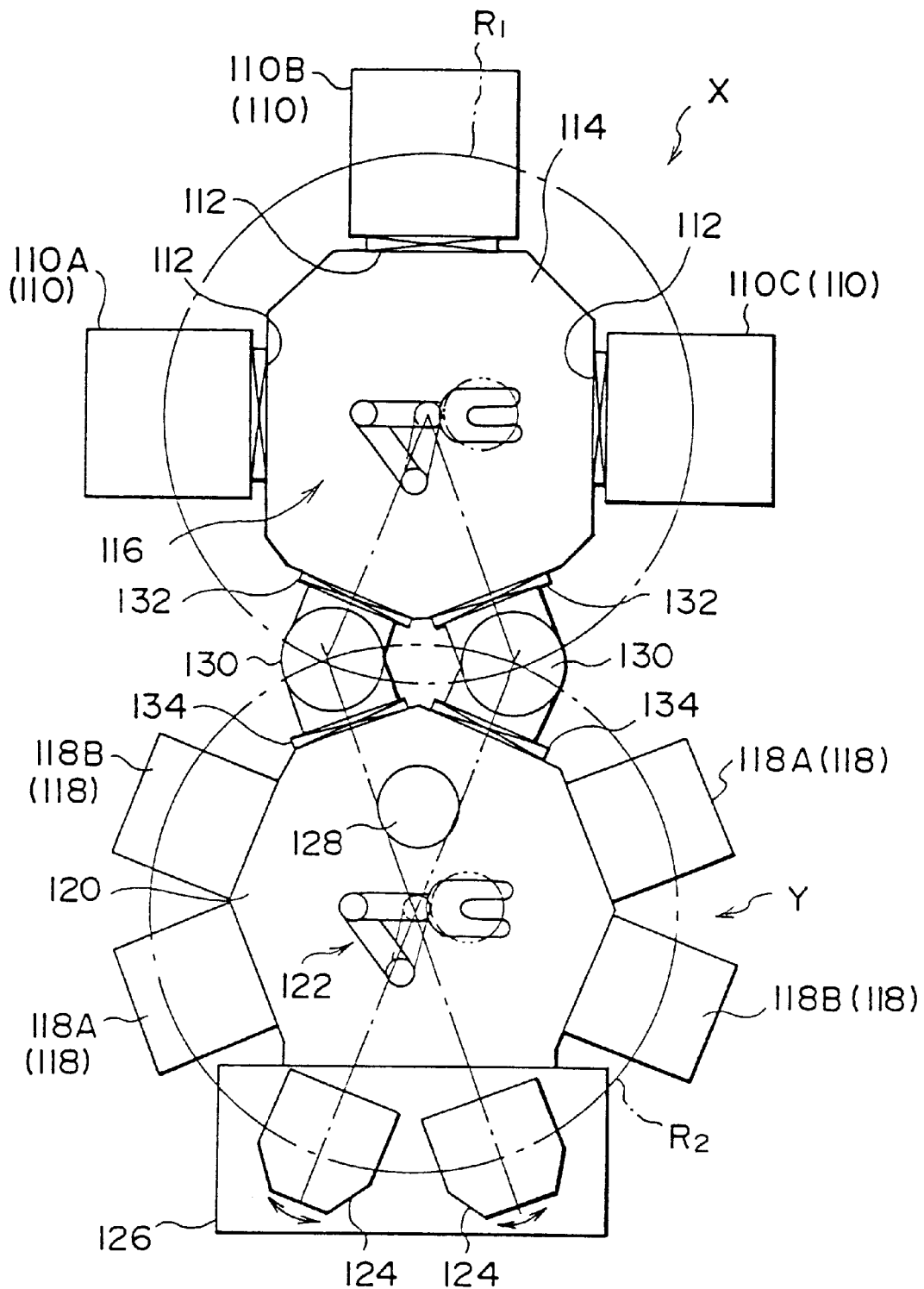
FIG. 7 is a diagrammatic plan view for illustrating an outline of a reduced- and normal-pressure treatment apparatus according to a third embodiment of the invention.

FIG. 7 schematically shows an outline of a reduced- and normal-pressure treatment apparatus according to a third embodiment of the present invention. This apparatus shows a treatment apparatus of a cluster-tool type for continuous treatment in which a plurality of treatment units are radially arranged around a chamber which houses transportation means such as a robot arm.

The reduced- and normal-pressure treatment apparatus according to the present embodiment comprises a reduced-pressure treatment unit X, a normal-pressure treatment unit Y, and load-lock chambers 130 connecting the two units, with process treatments being carried out individually in each of the treatment units.

The reduced-pressure treatment unit X comprises a plurality of reduced-pressure process chambers 110, a reduced-pressure transfer chamber 114 connected to the process chambers 110 by means of first gate devices 112, individually, and first transportation means 116 for delivering the to-be-treated objects to and from the process chambers.

As shown in FIG. 7, for example, the reduced-pressure process chambers 110 include a plurality of chambers 110A, 110B, and 110C which are arranged for a plurality of treatments. The details of the treatments in these chambers will be described later.

An openable gate valve (hereinafter referred to as first gate valve 112) is used as each first gate device 112, and it allows the reduced-pressure transfer chamber 114 and the reduced-pressure process chambers 110 to communicate with one another when it is opened.

As shown in FIG. 7, moreover, the reduced-pressure transfer chamber 114 is polygonal in shape, and defines a decompressed space which can communicate with the individual reduced-pressure process chambers 110 by means of the first gate valves 112. According to the present embodiment, the process chambers 110 are arranged symmetrically vertically.

A robot arm (hereinafter referred to as first robot arm 116), for use as the first transportation means 116, is located in the central portion of the reduced-pressure transfer chamber 114 so as to be rotatable around the center of the chamber 114. The first robot arm 116 is a multi-joint arm which has a bearing surface for the object to-be-treated. In FIG. 7, dashed line indicates a maximum transportation range R1 which is defined by an end portion of the arm in its maximally extended state.

By way of example, the pressure in the reduced-pressure transfer chamber 114 is adjusted to a degree of vacuum of $10^{-3}$ to $10^{-6}$ Torr.

The three reduced-pressure process chambers 110 may be used as CVD treatment units for continuous or parallel filming processes of the same or different kinds. Alternatively, three process chambers may be provided for etching. In another possible arrangement, two process chambers are used for etching, and another chamber for an ashing process for resist removal. Alternatively, moreover, two process chambers may be used as CVD process chambers for filming processes of the same or different kinds. In this case, another process chamber for a treatment which precedes the CVD treatment is utilized as an etching chamber for removing a natural oxide film on the surface of the object to-be-treated.

On the other hand, the normal-pressure treatment unit Y comprises a plurality of normal-pressure process chambers 118, a normal-pressure transfer chamber 120 communicating with the process chambers 118, and second transportation means 122 for delivering the objects to-be-treated to and from the process chambers 118.

The normal-pressure process chambers 118 are used to execute process treatments under atmospheric pressure or higher positive pressure. In the present embodiment, the process chambers 118 are four in number, and are arranged in positions which are symmetrical with respect to the vertical center line in FIG. 7.

In the example shown in FIG. 7, the four normal-pressure process chambers include a pair of cleaning chambers 118A and a pair of drying chambers 118B. Thus, before the objects to-be-treated are carried into the reduced-pressure process chambers 110, they can be cleaned or washed in hydrofluoric acid or pure water in the cleaning chambers 118A and dried in the drying chambers 118B. After the treatments in the process chambers 110 are finished, moreover, the objects to-be-treated can be washed or cleaned in hydrofluoric acid or pure water in the cleaning chambers 118A, dried in the drying chambers 118B, and returned to a cassette. Also, the objects to-be-treated can be spun as they are cleaned or dried.

The normal-pressure process chambers 118 can be arranged so that they can carry out various other necessary normal-pressure treatments than the cleaning and drying treatments before or after a reduced-pressure treatment. When etching is effected in the reduced-pressure process chambers 110, for example, a baking process may be executed in one of the normal-pressure process chambers 118 such that chlorine in the resist remaining after the etching is removed by baking. This baking process is carried out at 200° C. for about 2 minutes, for example. After undergoing the baking process, the objects to-be-treated can be cooled in another normal-pressure process chamber 118 and returned to the cassette.

In the normal-pressure treatment unit Y constructed in this manner, a treatment ambient gas may be exposed to the atmosphere so that the treatments are conducted under atmospheric pressure. Preferably, the treatment gas may be adjusted to a positive pressure a little higher than atmospheric pressure. An inert gas, such as $N_2$ or $CO_2$ gas, is used to set the positive pressure so that impurities can be discharged and prevented from entering.

As shown in FIG. 7, the normal-pressure transfer chamber 120 is polygonal in shape, and communicates with the inlet of each normal-pressure process chamber 118. The chamber 120 contains a robot arm (hereinafter referred to as second robot arm) 122, for use as the second transportation means, which has a center of rotation in its central portion. In the present embodiment, the normal-pressure process chambers 118 are arranged symmetrically with respect to the vertical center line of the chamber 120.

The second robot arm 122 is a contractible multi-joint arm having a distal end capable of vacuum suction in a normal-pressure ambient gas. In FIG. 7, dashed line indicates a maximum transportation range R2 obtained when the arm 122 is extended to its maximum.

The respective transportation ranges R1 and R2 of the first and second robot arms 116 and 122 share an overlapping portion, at which the load-lock chambers 130 are located.

Thus, in the present embodiment, the load-lock chambers 130 are arranged symmetrically with respect to an extension of a segment which connects the respective centers of rotation of the first and second robot arms 116 and 122. Moreover, the chambers 130 have a transfer space for the objects to-be-treated in the overlapping portion of the transportation ranges. Gate valves (hereinafter referred to as second and third gate valves 132 and 134) for use as second and third gate devices are mounted individually in those positions where the load-lock chambers 130 communicate with the reduced- and normal-pressure transfer chambers 114 and 120.

The load-lock chambers 130 are designed for replacement between the atmosphere and a vacuum. Thus, the ambient gas pressure in each chamber 130 is changed from atmospheric pressure to vacuum pressure when the objects to-be-treated are transferred from the normal-pressure transfer chamber 120 to the reduced-pressure transfer chamber 114, and from vacuum pressure to atmospheric pressure when the objects are transferred from the chamber 114 to the chamber 120. Also, each load-lock chamber 130 may be furnished with heating and cooling mechanisms. With use of these mechanisms, the objects to-be-treated carried from the reduced-pressure transfer chamber 120 into the reduced-pressure treatment unit X or from the treatment unit X into the normal-pressure treatment unit Y can be preheated or pre-cooled. The preheating can shorten the heating time which is required in heating the objects to-be-treated to a treatment temperature in the reduced-pressure process chambers 110. The pre-cooling prevents an oxide film from being formed unexpectedly as the heated objects to-be-treated touch the atmosphere when they are carried out from the reduced-pressure treatment unit X.

If the objects to-be-treated are thus preheated or cooled in the load-lock chambers 130, they can be surrounded by a vacuum adiabatic ambience, efficient heating and cooling can be accomplished.

Cassettes 124, which are stored with a plurality of objects to-be-treated each, are arranged individually on all the sides of the polygon of the normal-pressure transfer chamber 120 except those sides on which the normal-pressure process chambers 118 and the load-lock chambers 130 are located.

The cassettes 124 are set on a cassette stage 126 so as to be symmetrical with respect to an extension of a segment which connects the respective centers of the reduced- and normal-pressure transfer chambers 114 and 120.

Preferably, the respective apertures of the cassettes 124 are directed to the center of rotation of the second robot arm 122 so that the objects to-be-treated can be securely loaded into and unloaded from the cassettes 124 by means of the arm 122. To attain this, the cassettes 124 are designed so as to be rockable, as indicated by the arrows in FIG. 7.

In the reduced- and normal-pressure treatment apparatus constructed in this manner, the objects to-be-treated transferred from one of the cassettes 124 are recovered in the same cassette. This is done because the incidence of cross-contamination increases if the cassette or carrier from which the objects to-be-treated are transferred is different from the one which receives the objects. Many of modern products are managed in lots by using ID codes or the like which are attached to cassettes or carriers. This is another reason why the same cassette or carrier is used for the reciprocal transfer.

In FIG. 7, numeral 128 denotes a table which constitutes an alignment section for the objects to-be-treated. The table 128 forms a vacuum chuck which can rotate and move up and down with an object held thereon by suction. A transmission-type sensor (not shown) is provided over the vacuum chuck, for example. The object to-be-treated, held on the chuck by suction, is aligned in a predetermined position by means of a signal from the sensor and a drive mechanism for the table, whereupon its orientation flat is positioned for orientation.

The following is a description of the present embodiment in which the distance of access of each object to-be-treated, subjected to the normal-pressure process treatment, to the reduced-pressure process treatment unit is shortened. In an initial state, the first to third gate valves 112, 132, and 134 are all kept closed.

First, an operator sets the cassettes 124 on the cassette stage 126 manually or by means of a robot handler. Then, the apertures of the cassettes 124 are adjusted so as to be directed to the center of rotation of the second robot arm 122.

When the cassettes 124 are mounted and oriented in this manner, the distal end of the second robot arm 122 is inserted under one of the objects to-be-treated, such as semiconductor wafers, in one of the cassettes 124. When the cassettes 124 are then slightly lowered by means of the stage 126, the one object to-be-treated is attracted to the distal end of the robot arm 122 by vacuum suction.

Figure 8:
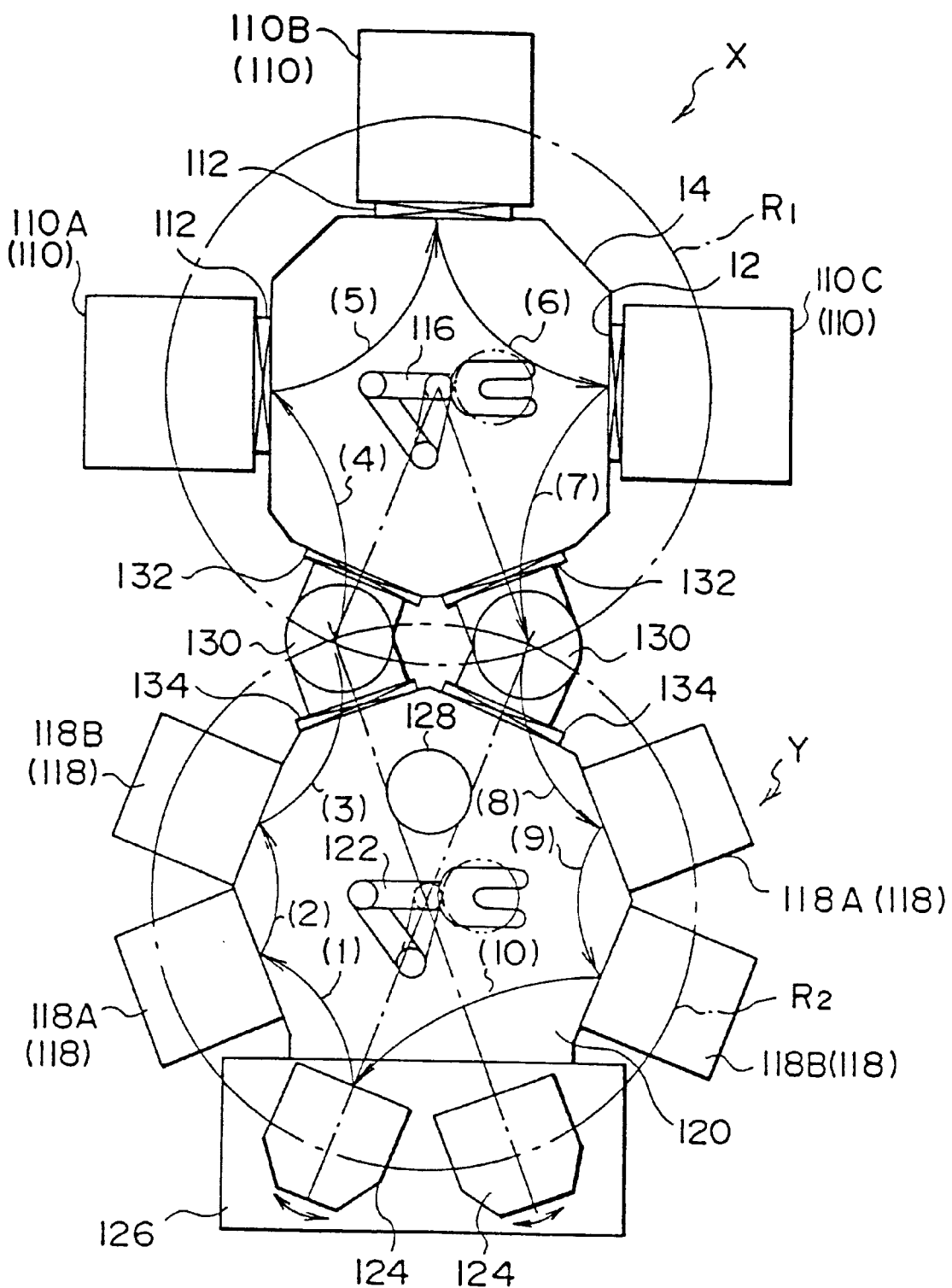
FIG. 8 is a diagrammatic view for illustrating an example of object transportation in the reduced- and normal-pressure treatment apparatus shown in FIG. 7.

Subsequently, the object to-be-treated taken out from the one cassette 124 is transferred into one of the process chamber 118A for cleaning, one of the four normal-pressure process chambers 118, by the robot arm 122, as indicated by arrow (1) in FIG. 8. When the cleaning process is finished, the object to-be-treated is taken out from the process chamber 118A by the robot arm 122, and then transferred into another process chamber 118B for drying, as indicated by arrow (2). Before the cleaning process or after the drying process, the object to-be-treated is aligned in the alignment section 128.

When the drying process is finished, the object to-be-treated is removed from the one process chamber 118B for drying by the robot arm 122, and is carried into one of the load-lock chambers 130, as indicated by arrow (3). In this case, the corresponding third gate valve 134, having so far been closed, is opened to allow the object to-be-treated to be carried in.

When the third gate valve 134 is closed after the object to-be-treated is carried in, the pressure in the load-lock chamber 130 is adjusted to substantially the same level as the reduced-pressure ambient gas in the reduced-pressure transfer chamber 114. Thereafter, the corresponding gate valve 132 is opened. The aforementioned preheating may be carried out simultaneously with this replacement of the atmosphere with the vacuum ambient gas.

Then, the first robot arm 116 in the reduced-pressure transfer chamber 114 takes out the object to-be-treated from the load-lock chamber 130, delivers it into the reduced-pressure process chamber 110A, as indicated by arrow (4), and sets the object in position.

When the corresponding first gate valve 112 is closed after the object to-be-treated is carried into the reduced-pressure process chamber 110A, the gas pressure in the chamber 110A is adjusted to a process pressure with a degree of vacuum higher than that of the pressure in the reduced-pressure transfer chamber 114. The degree of vacuum of the ambient gas surrounding the object to-be-treated increases as the object, under normal pressure at the beginning, transfers from the load-lock chamber 130 to the process chamber 110A via the reduced-pressure transfer chamber 114. A predetermined first reduced-pressure treatment is carried out in the reduced-pressure process chamber 110A.

When the first reduced-pressure treatment is finished, the object to-be-treated is transferred in succession into the reduced-pressure process chambers 110B and 110c via the reduced-pressure transfer chamber 114 by the robot arm 116, as indicated by arrows (5) and (6), whereupon second and third reduced-pressure process treatments are executed.

After these reduced-pressure process treatments are accomplished, the object to-be-treated in the reduced-pressure process chamber 110C is transferred into the other load-lock chamber 130 by the first robot arm 116, as indicated by arrow (7). The vacuum load-lock chamber 130 replaces the internal atmosphere of the load-lock chamber. At this time, the object to-be-treated can be also cooled. Thus, the object to be carried out thereafter into the atmosphere can be prevented from being formed with a useless oxide film.

After the ambient gas replacement in the load-lock chamber 130 is finished, the corresponding third gate valve 134 is opened, whereupon the object to-be-treated is transferred into the other normal-pressure process chamber 118A for cleaning by the second robot arm 122, as indicated by arrow (8).

When the treatment in the normal-pressure process chamber 118A is finished, the object to-be-treated is carried out from the chamber 118A by the second robot arm 122, and is transferred into the other normal-pressure process chamber 118B for drying, as indicated by arrow (9).

When the drying process in the normal-pressure process chamber 118B is finished, the object to-be-treated is transferred to the original cassette 124, out of the two cassettes 124, as indicted by arrow (10). Preferably, at this time, the object is loaded into the cassette 124 after it is placed on the table 128 so that its orientation flat is positioned for orientation.

Each object to-be-treated, which is transferred from one cassette and subjected to the various treatments, is bound to return to the same cassette. Thus, the objects to-be-treated stored in the cassettes can be managed by using the ID codes which are attached to cassettes. Since each object is unloaded from and loaded into one and the same cassette, moreover, there is no possibility of cross-contamination, so that the trouble of removing contaminants through cassette cleaning or the like can be saved.

The steps of procedure for loading and unloading the objects to-be-treated according to the foregoing embodiments are not limited to the ones described above. Thus, the procedure of transportation of the objects to-be-treated can be changed depending on the number of the treatment processes.

Figure 9:
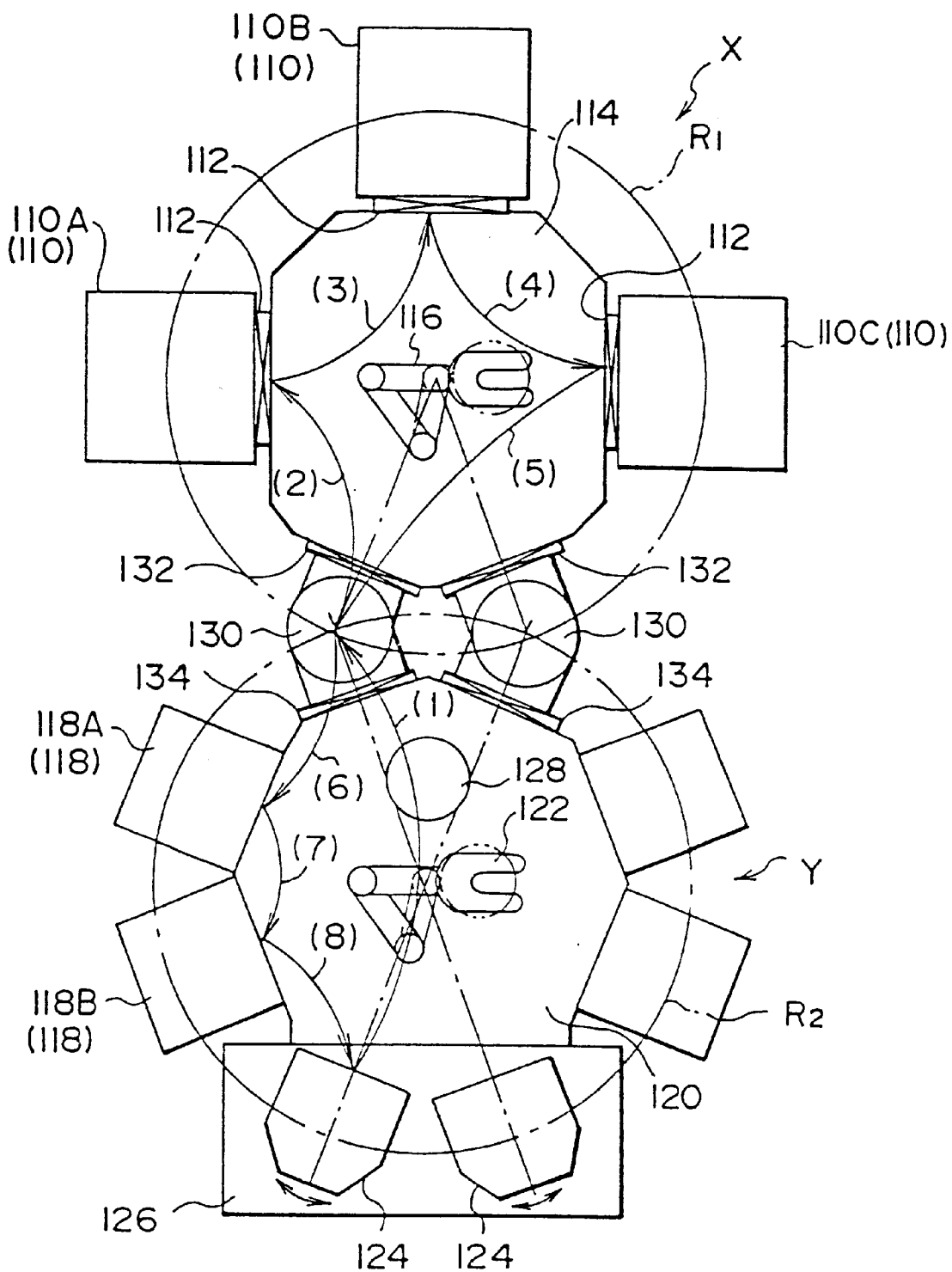
FIG. 9 is a diagrammatic view for illustrating another example of object transportation in the reduced- and normal-pressure treatment apparatus shown in FIG. 7.

FIG. 9 illustrates alternative steps of transportation procedure. In this case, a normal-pressure process treatment is carried out only after a reduced-pressure process treatment. According to this procedure, therefore, an object to-be-treated is transferred by the second robot arm 122 from one of the cassettes 124 into one load-lock chamber 130 whose third gate valve 134 is open, as indicated by arrow (1) in FIG. 9. Naturally, the object to-be-treated can be aligned in the alignment section 128 before this transfer.

Thereafter, the object to-be-treated is transferred in succession into, for example, the three reduced-pressure process chambers 110A to 110C, as indicated by arrows (2) to (4), whereupon reduced-pressure processes of the same kind or different kinds are executed.

When the treatment in the reduced-pressure process chamber 110C is finished, the corresponding first gate valve 112 is opened, whereupon the object to-be-treated is transferred into the one load-lock chamber 130 by the first robot arm 116, as indicated by arrow (5) in FIG. 9. In the procedure of transportation shown in FIG. 9, the left-hand load-lock chamber 130 is used for the transfer of the objects to-be-treated in the left-hand cassette 124. Thus, if the right-hand load-lock chamber 130 of FIG. 9 is used for the transfer of the objects to-be-treated in the right-hand cassette 124, the objects in the two cassettes 124, left and right, can be treated in parallel with one another.

After the ambient gas is replaced in the load-lock chamber 130 in the same manner as aforesaid, the object to-be-treated is transported in succession to the normal-pressure process chambers 118A and 118B by the second robot arm 122, as indicated by arrows (6) and (7) in FIG. 9. If the treatment in the reduced-pressure process chambers 110 is etching, for example, the aforesaid baking process for the removal of chlorine from the resist is executed in the process chamber 118A. Thereafter, the object to-be-treated is cooled in the process chamber 118B. After these two normal-pressure process treatments, the object is returned to the original cassette 124, as indicated by arrow (8) in FIG. 9.

In the embodiments described above, the two cassettes stored with the objects to-be-treated are designed so as to rock on the cassette stage 124 in a manner such that their respective apertures are directed to the center of rotation of the robot arm 122. However, the number and setup of the cassettes may be changed.

Figure 10:
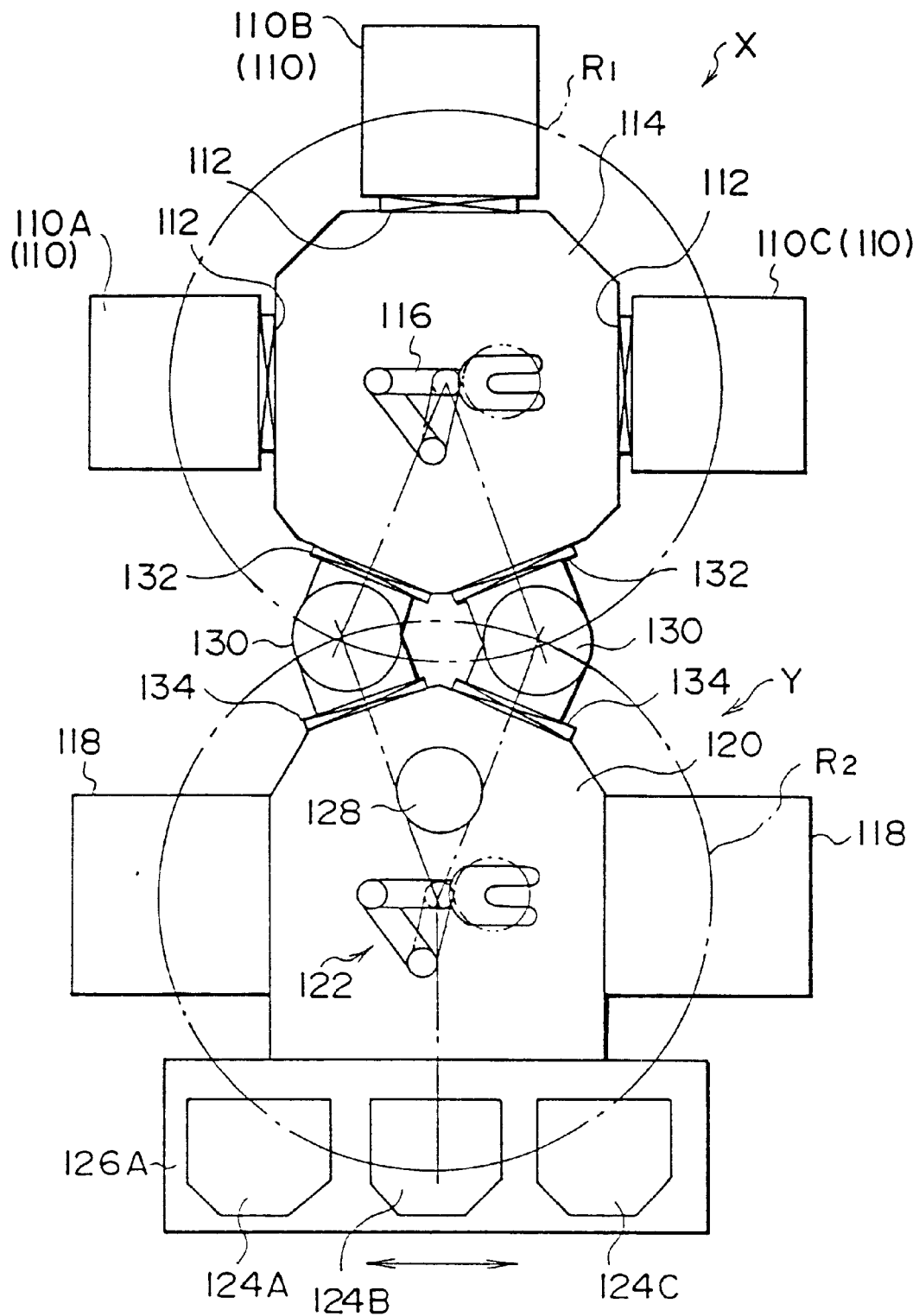
FIG. 10 is a diagrammatic view showing a partial modification of the reduced- and normal-pressure treatment apparatus shown in FIG. 7.

FIG. 10 shows an example of a modified cassette arrangement. In this case, three cassettes are arranged on a stage 126A which can move straight in the direction indicated by the arrow in a manner such that any one of the cassettes is situated within the transportation range of the robot arm 122.

More specifically, cassettes 124A, 124B, and 124C are mounted on the cassette stage 126A which move in the horizontal direction, as shown in FIG. 10. One of the cassettes 124A to 124C on the stage 126A is stopped at a position right opposite to the second robot arm 122. In the state shown in FIG. 10, the objects to-be-treated can be loaded into or unloaded from the central cassette 124B.

Figure 11:
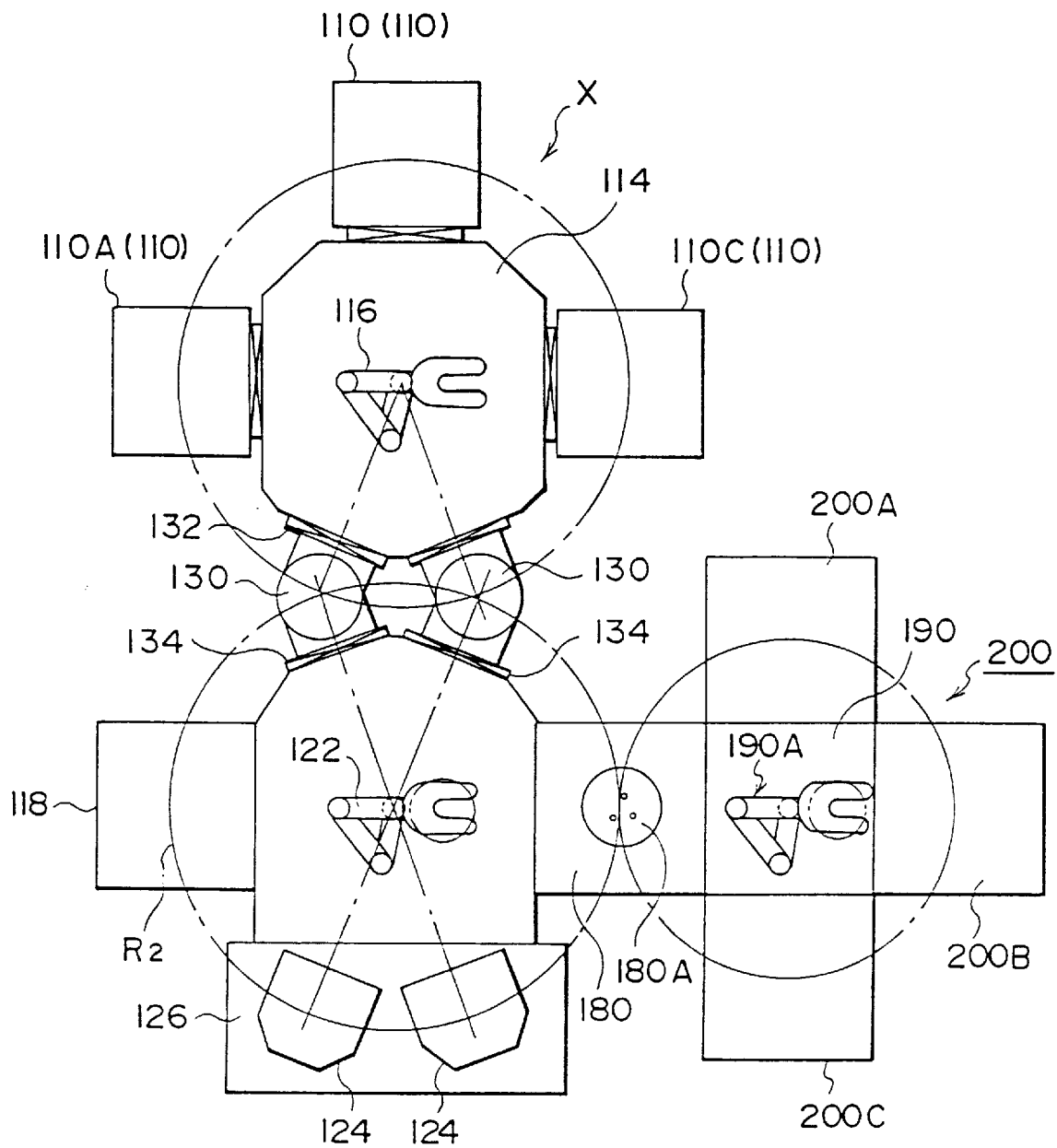
FIG. 11 is a diagrammatic view showing another partial modification of the reduced- and normal-pressure treatment apparatus shown in FIG. 7.

In an alternative example of the transportation system for the objects to-be-treated, as shown in FIG. 11, one of the normal-pressure process chambers in the normal-pressure treatment unit Y is used as a place of transfer for the objects to-be-treated, and a treatment unit including another robot arm is provided on the other side of the transfer section.

One of the normal-pressure process chambers 180 has a mounting portion 180A for the objects to-be-treated therein, and a second normal-pressure transfer chamber 190 is located adjacent to the mounting portion 180A. A robot arm 190A is provided in the second normal-pressure transfer chamber 190 in a manner such that its distal end is situated overlapping the transportation range R2 of the second robot arm 122 of the normal-pressure treatment unit Y when the arm 190A is extended to its maximum. A plurality of normal-pressure process chambers 200A, 200B, and 200C for normal-pressure process treatment are located at equal distances from the center of rotation of the robot arm 190A.

This arrangement is advantageous in the case where too many normal-pressure process chambers to be confined to the transportation range of the one robot arm 122 are installed additionally. Alternatively, the normal-pressure process chambers 200A, 200B, and 200C for special treatments may be located in isolated positions where they exert no bad influences upon the reduced- and normal-pressure treatment units X and Y.

Figure 12:
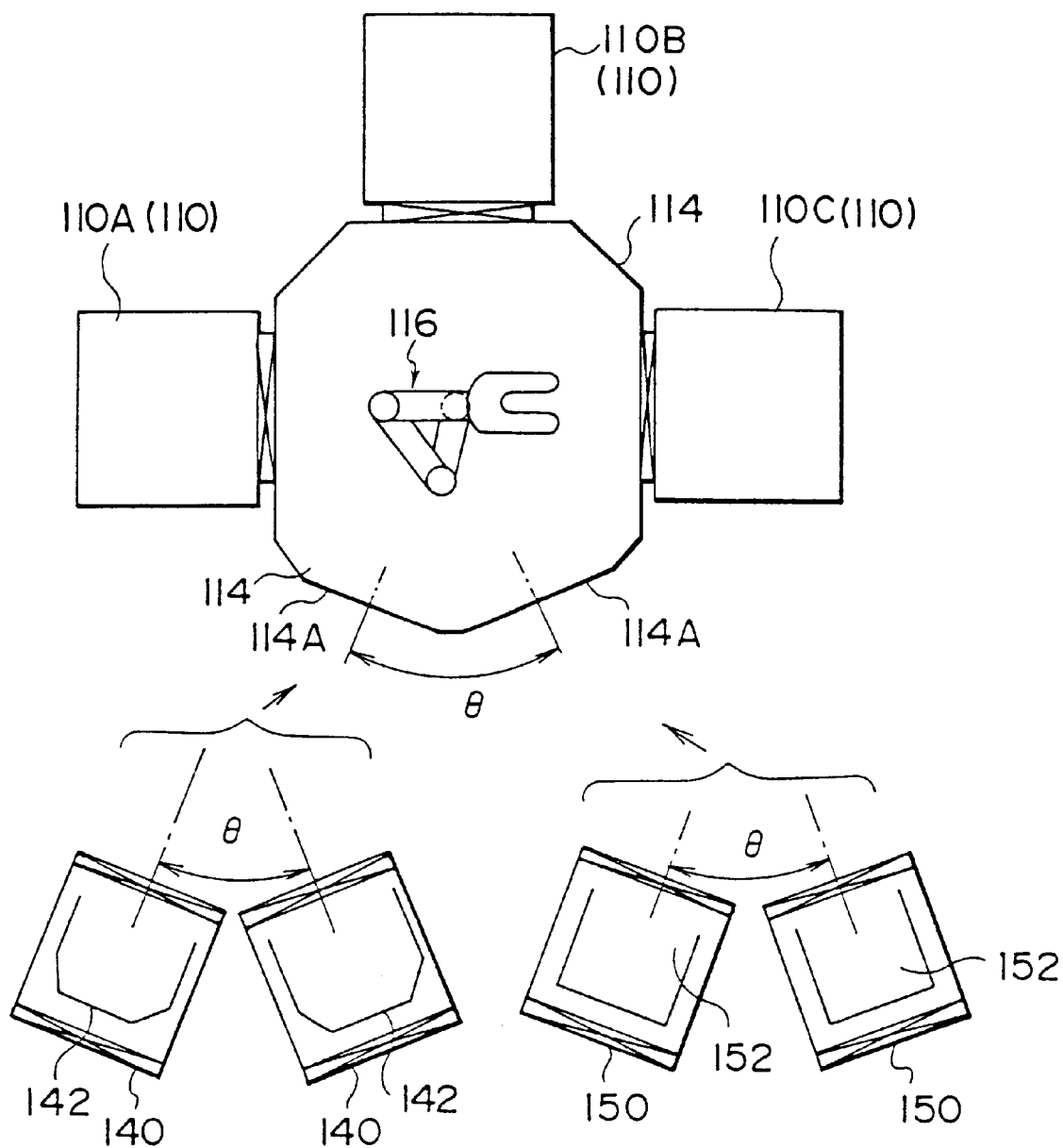
FIG. 12 is a diagrammatic view for illustrating a function such that a plurality of types of load-lock chambers can be connected in common to a reduced-pressure transfer chamber shown in FIG. 7.

The following is a description of an arrangement of a general-purpose version of the reduced-pressure treatment unit X. Referring to FIG. 12, the reduced-pressure transfer chamber 114 of the treatment unit X is designed so that its interfaces 114A fixedly connect to, e.g., two load-lock chambers have a common shape such that they can be connected alternatively with various load-lock chambers.

The reduced-pressure transfer chamber 114 shown in FIG. 12 can be connected with two different types of load-lock chambers besides the load-lock chambers 130 shown in FIGS. 7 to 11.

As shown in FIG. 12, load-lock chambers 140 on one side can contain a plastic cassette 142 of the SEMI standard type each. The cassettes 142 may be formed of polytetrafluoroethylene or polypropylene. Load-lock chambers 150 on the other side are adapted for high-vacuum service, and can contain a metallic cassette 152 each. Since the cassettes 152 are formed of metal, they suffer no outgassing even under high vacuum. The versatile reduced-pressure transfer chamber 114, which can be connected with various load-lock chambers, has its cassette mounting surfaces 114A shaped in common for the two types of cassettes. Although any of these cassettes are allowed to be in contact with the atmosphere, SMIF boxes each stored with a plurality of cassettes may alternatively be connected in common to the reduced-pressure transfer chamber 114.

It is to be understood that the present invention is not limited to the embodiments described above, and that various changes and modifications may be effected therein by one skilled in the art without departing from the scope or spirit of the invention. In particular, the reduced-pressure process treatments and the normal-pressure process treatments which directly precede or follow the reduced-pressure treatments as pre- or post-treatments can be applied to various other process treatments which are essential to the manufacture of semiconductors. In the foregoing embodiments, moreover, the objects to-be-treated are process-treated in sheet form in the reduced- and normal-pressure process treatment units, and each load-lock chamber has a capacity to accommodate one object to-be-treated. Alternatively, each load-lock chamber may be given a capacity to accommodate a plurality of objects to-be-treated. According to this arrangement, the next object to be supplied to each reduced-pressure process chamber can be kept on standby, so that the operating efficiency of the reduced-pressure process chambers, and hence the throughput, can be improved. Also, the load-lock chambers are made to be open to the atmosphere less frequently, so that the frequency at which impurities in the atmosphere get into the region on the reduced-pressure side is lowered, and the yield of each treatment is improved.

According to the reduced- and normal-pressure treatment apparatus described herein, the time interval between the reduced- and normal-pressure process treatments is shortened, and the handling frequency for the objects to-be-treated is lowered, so that the treatment quality and throughput can be improved.

Further, the stroke of transportation between the reduced- and normal-pressure process treatment units can be minimized, so that the aforesaid time interval can be additionally shortened.

Furthermore, each necessary treatment is executed immediately when each object to-be-treated, transferred between the reduced- and normal-pressure process treatment units, transfers to one of the treatment units. Therefore, a state established as the result of each treatment can be prevented from changing.

Since each load-lock chamber has the capacity to accommodate a plurality of objects to-be-treated, moreover, the next object to be supplied to each reduced-pressure process chamber can be kept on standby, so that the operating efficiency of the reduced-pressure process chambers, and hence the throughput, can be improved.

Furthermore, impurities can be prevented from getting into the reduced- and normal-pressure process treatment units, so that the treatment space can be kept clean, and the treatment quality and yield can be improved.

While the presently preferred embodiments of the present invention have been shown and described, it is to be understood that this disclosure is for the purpose of illustration and that various changes and modifications may be made without departing from the scope of the invention as set forth in the appended claims.

What is claimed is:

1. A multi-chamber treatment system comprising:

a substantially polygonal transfer chamber, a plurality of vacuum process chambers arranged in a polygonal shape around the transfer chamber, the number of which is initially variable and in each of which a process is to be performed, each of the vacuum process chambers communicating with the transfer chamber through a first type gate valve, wherein the number of vacuum process chambers to be arranged around the transfer chamber is set in direct dependence upon the desired number of processes to be performed, and wherein the transfer chamber has a shape and size designed according to the set number of vacuum process chambers, at least one load-lock chamber communicating with the transfer chamber through a second type gate valve, and a rotatable and expandable transfer arm having a hand portion for holding an object to-be-treated, and multi-joint arms including a first portion and a second portion which are rotatable connected, the transfer arm being located in the transfer chamber and adapted to fetch the object to-be-treated from said at least one load-lock chamber and to carry the object to-be-treated into each vacuum process chamber, and to remove the object processed from each vacuum process chamber and return the object to said at least one load-lock chamber;

the transfer arm being extendable from a minimum extension defining a radius of rotation such that the arm can rotate in a transfer chamber of a minimum size corresponding to a minimum number of vacuum process chambers to a maximum arm extension such that the transfer arm can deliver the object to-be-treated to each vacuum process chamber when the transfer chamber is of a maximum size corresponding to a maximum number of vacuum process chambers, wherein a minimum radius R of rotation of the transfer arm is defined as $$R = \frac{Q + 2r_1(\cos\theta_2) + r_1 + W_r}{2\cos\theta_2 + 2},$$

such that when $\theta_2 = 0$, $$R = \frac{Q + 3r_1 + r_1 + W_r}{4},$$

and wherein $r_1$ is a radius of the first portion of the multi-joint arms, $\theta_2$ is a minimum opening angle between a center line (L3) of the transfer arm and a center line (L4) of the multi-joint arms, $W_r$ is a radius of the object to-be-treated, and Q is a maximum arm extension.

2. The multi-chamber treatment system according to claim 1, which further comprises transfer arm control means in which can be stored information concerning:

(a) a route for processing the object to-be-treated, (b) the number of vacuum process chambers attached to the transfer chamber, (c) the dimensions of the transfer chamber based on the number of vacuum process chambers, and (d) the length of the hand portion.

3. The multi-chamber treatment system according to claim 1, wherein the transfer chamber includes a cover for sealing the transfer chamber, the cover being divided into at least two divisions such that the transfer chamber is opened and closed by opening and closing one of the divisions.

4. The multi-chamber treatment system according to claim 1, wherein the hand portion of the transfer arm has two hands for individually carrying two objects to-be-treated.

5. A multi-chamber treatment system according to claim 1, further comprising a first normal-pressure treatment device and a second normal-pressure treatment device, the first normal-pressure treatment device including a first normal-pressure transfer chamber connected by said at least one load-lock chamber to the polygonal transfer chamber, at least one normal-pressure process treatment unit, and a first normal-pressure transfer arm located within the first normal-pressure transfer chamber and being extendable to transport the object to-be-treated between said at least one load-lock chamber and at least one normal-pressure process treatment unit of the second normal-pressure treatment device, and the second normal-pressure treatment device including a second normal-pressure transfer chamber, a process chamber with a mounting member connecting the first normal-pressure transfer chamber and the second normal-pressure transfer chamber, said at least one normal-pressure process treatment unit of the second normal-pressure treatment device, and a second normal-pressure transfer arm located within the second normal-pressure transfer chamber and being extendable to transport an object to-be-treated between the process chamber with the mounting member and the said at least one normal-pressure process treatment unit of the second normal-pressure treatment device.

6. The multi-chamber treatment system according to claim 1, which further comprises an alignment mechanism situated in a fixed position beyond the minimum radius of rotation of the transfer arm in the transfer chamber such that the alignment mechanism receives the object to-be-treated from the transfer arm, and said alignment mechanism aligns the object to-be-treated for treatment.

7. The multi-chamber treatment system according to claim 6, wherein two load-lock chambers are arranged at a suitable angle with respect to each other so that respective center lines thereof are directed to a pivot center of the transfer arm, and wherein the alignment mechanism is situated halfway between the respective center lines of the two load-lock chambers.

8. A multi-chamber treatment system according to claim 1, further comprising:

a normal-pressure treatment device including:

a normal-pressure process treatment unit for treating the object to-be-treated under pressure not lower than normal pressure;

a normal-pressure transfer chamber; and a transportation means for transporting the object to-be-treated under pressure not lower than normal pressure; and wherein said at least one load-lock chamber connects the polygonal transfer chamber and the normal-pressure transfer chamber, and wherein ambient pressure within said at least one load-lock chamber is replaceable with one of atmospheric and vacuum pressure, the not-lower-than-normal pressure transportation means being capable of loading the object to-be-treated into the normal-pressure process treatment unit and said at least one load-lock chamber.

9. A multi-chamber treatment system according to claim 8, wherein the not-lower-than-normal pressure transportation means includes a transfer arm.

10. A multi-chamber treatment system according to claim 1, further comprising:

a normal-pressure treatment device including a normal-pressure process treatment unit for treating the object to-be-treated under pressure not lower than normal pressure as the object-to-be-treated is transferred to a region within a transportation range of a transportation means for transporting the object to-be-treated under pressure not lower than normal pressure; and wherein said at least one load-lock chamber is located in a position where respective transportation ranges of the transfer arm located in the polygonal transfer chamber and the not-lower-than-normal pressure transportation means overlap each other, and said at least one load-lock chamber is adapted to connect locations to which the object to-be-treated is transported by the transfer arm and the not-lower-than-normal pressure transportation means and to replace ambient pressure therein with one of atmospheric and vacuum pressure.

11. A multi-chamber treatment system according to claim 10, wherein the not-lower-than-normal pressure transportation means includes a transfer arm.

12. A multi-chamber treatment system comprising:

a substantially polygonal transfer chamber, a plurality of vacuum process chambers arranged in a polygonal shape around the transfer chamber, the number of which is initially variable and in each of which a process is to be performed, each of the vacuum process chambers communicating with the transfer chamber through a gate valve, wherein the number of vacuum process chambers in communication with the transfer chamber is set in direct dependence upon the processes to be performed and wherein the transfer chamber has a shape and a size designed according to the set number of vacuum process chambers, at least one load-lock chamber communicating with the transfer chamber through a gate valve, and a rotatable and expandable transfer arm having a pair of hand portions for holding an object to-be-treated, and multi-joint arms including a first portion and a second portion which are rotatable connected, the transfer arm being located in the transfer chamber and adapted to fetch the object to-be-treated from said at least one load-lock chamber and to carry the object to-be-treated into each vacuum process chamber, and to remove the object processed from each vacuum process chamber and return the object to said at least one load-lock chamber;

the transfer arm being extendable from a minimum extension defining a radius of rotation such that the arm can rotate in a transfer chamber of a minimum size corresponding to a minimum number of vacuum process chambers to a maximum arm extension such that the transfer arm can deliver the object to be-treated to each vacuum process chamber when the transfer chamber is of a maximum size corresponding to a maximum number of vacuum process chambers, wherein a minimum radius R of rotation of the arm is defined as $$R = \frac{Q + 2r_1(\cos\theta_2) + r_1 + W_r}{2\cos\theta_2 + 2}$$

such that when $\theta_2 = 0$ $$R = \frac{Q + 3r_1 + W_r}{4},$$

and wherein $r_1$, is a radius of the first portion of the multi-joint arms, $\theta_2$ is a minimum opening angle between a center line (L3) of the transfer arm and a center line (L4) of the multi-joint arms, $W_r$ is a radius of the object to-be-treated, and Q is a maximum arm extension.

* * * * *

UNITED STATES PATENT AND TRADEMARK OFFICE
CERTIFICATE OF CORRECTION

PATENT NO.       : 5,934,856
APPLICATION NO.  : 08/837948
DATED            : August 10, 1999
INVENTOR(S)      : Teruo Asakawa and Hiroaki Saeki It is certified that error appears in the above-identified patent and that said Letters Patent is hereby corrected as shown below:

Col. 23, change claim 1, lines 24 and 25 from $$R = \frac{Q + 3r_1 + r_1 + W_r}{4},$$

to $$R = \frac{Q + 3r_1 + W_r}{4},$$

Signed and Sealed this
Eleventh Day of October, 2011

David J. Kappos
*Director of the United States Patent and Trademark Office*